US012600634B2

(12) United States Patent
Cao et al.

(10) Patent No.: US 12,600,634 B2
(45) Date of Patent: Apr. 14, 2026

(54) 2D AMORPHOUS CARBON FILM ASSEMBLED FROM GRAPHENE QUANTUM DOTS

(71) Applicants: The Board of Trustees of the University of Illinois, Urbana, IL (US); National Energy Technology Laboratory, Pittsburgh, PA (US)

(72) Inventors: Qing Cao, Champaign, IL (US); Fufei An, Urbana, IL (US); Christopher Matranga, Pittsburgh, PA (US); Congjun Wang, Bethel Park, PA (US); Viet Hung Pham, Bethel Park, PA (US)

(73) Assignee: United States Department of Energy, Washington, DC (US)

( * ) Notice: Subject to any disclaimer, the term of this patent is extended or adjusted under 35 U.S.C. 154(b) by 1052 days.

(21) Appl. No.: 17/707,521

(22) Filed: Mar. 29, 2022

(65) Prior Publication Data

US 2022/0306476 A1     Sep. 29, 2022

Related U.S. Application Data

(60) Provisional application No. 63/318,420, filed on Mar. 10, 2022, provisional application No. 63/167,422, filed on Mar. 29, 2021.

(51) Int. Cl.
| | |
|---|---|
| *C01B 32/194* | (2017.01) |
| *H10D 64/68* | (2025.01) |

(Continued)

(52) U.S. Cl.
CPC ........... *C01B 32/194* (2017.08); *H10D 64/68* (2025.01); *H10N 70/8845* (2023.02);

(Continued)

(58) Field of Classification Search
CPC ... C01B 32/194; C01B 32/182; C01B 32/198; B82Y 15/00; B82Y 10/00;

(Continued)

(56) References Cited

U.S. PATENT DOCUMENTS

2019/0031906 A1 *     1/2019   Kim ...................... C01B 32/182

OTHER PUBLICATIONS

"How 2D semiconductors could extend Moore's law", Springer Nature Limited, Mar. 14, 2019, vol. 567, pp. 169-170.

(Continued)

*Primary Examiner* — Tabassom Tadayyon Eslami
(74) *Attorney, Agent, or Firm* — McDonnell Boehnen Hulbert & Berghoff LLP

(57) ABSTRACT

Amorphous two-dimensional graphene-like carbon films provide benefits to a variety of applications due to advantageous electrical, mechanical, and chemical properties. Methods are provided to efficiently and cheaply create high-quality amorphous two-dimensional carbon films with embedded graphene-like nanocrystallites using coal as a precursor. These methods employ solution-phase deposition of coal-derived graphene-containing quantum dots followed by relatively low-temperature annealing/crosslinking of the quantum dots to form a single two-dimensional layer of carbon that includes a plurality of randomly-oriented discrete graphene domains connected to each other via amorphous carbon regions. Multi-layer films can be easily created by repeating the deposition and annealing processes. Two-dimensional carbon films formed in this manner exhibit improved properties when compared to crystalline graphene sheets and have properties especially suited to use as the storage medium of memristors. Further processing can result in large free-standing two-dimensional graphene-like carbon thin films that can be used as membranes or for other applications.

17 Claims, 11 Drawing Sheets

(51) Int. Cl.
    *H10N 70/00*      (2023.01)
    *B82Y 30/00*      (2011.01)
    *B82Y 40/00*      (2011.01)

(52) U.S. Cl.
    CPC ............... *B82Y 30/00* (2013.01); *B82Y 40/00* (2013.01); *C01B 2204/02* (2013.01); *C01B 2204/04* (2013.01); *C01B 2204/22* (2013.01); *C01P 2002/82* (2013.01); *C01P 2004/04* (2013.01)

(58) Field of Classification Search
    CPC ......... H01L 21/02628; H01L 21/02115; H01L 21/044; H01L 1/02601; H10D 64/68; H10D 62/882
    USPC ........................................................ 427/122
    See application file for complete search history.

(56)          References Cited

OTHER PUBLICATIONS

Yu et al., "Insulators for 2D nanoelectronics: the gap to bridge", Nature communications, 15 pages.
Chhowalla et al., "Two-dimensional semiconductors for transistors", Nature Reviews, vol. 1, Nov. 2016, 15 pages.
Knobloch et al., "The performance limits of hexagonal boron nitride as an insulator for scaled CMOS devices based on two-dimensional materials", Nature Electronics, vol. 4, Feb. 2021, pp. 98-108.
Toh et al., "Synthesis and properties of free-standing monolayer amorphous carbon" Nature, vol. 577, Jan. 9, 2020, 16 pages.
Hong et al., "Ultralow-dielectric-constant amorphous boron nitride", Nature, vol. 582, Jun. 25, 2020, 16 pages.
Joo et al., "Realization of continuous Zachariasen carbon monolayer" Science Advances, vol. 3, Feb. 10, 2017.
Ye et al., "Coal as an abundant source of graphene quantum dots", Nature communications, Dec. 6, 2013, 7 pages.
Matsuba et al., "Neat monolayer tiling of molecularly thin two-dimensional materials in 1 min", Science Advances, 2017, 9 pages.
Shearer et al., "Accurate thickness measurement of graphene", Nanotechnology 27 (2016), 11 pages.
Thodkar et al., "Restoring the Electrical Properties of CVD Graphene via Physisorption of Molecular Adsorbates", Applied Materials & Interfaces, 2017, 9 pages.
Schultz et al., "Synthesis of linked carbon monolayers: Films, balloons, tubes, and pleated sheets", PNAS, May 27, 2008, vol. 105, No. 21, pp. 7353-7358.
Barreiro et al., "Understanding the catalyst-free transformation of amorphous carbon into graphene by current-induced annealing", Scientific Reports, Jan. 23, 2013, 6 pages.
Lee et al., "Measurement of the Elastic Properties and Intrinsic Strength of Monolayer Graphene", Science, vol. 321, Jul. 18, 2008, 5 pages.

Kim et al., "Realization of a high mobility dual-gated graphene field-effect transistor with A12O3 dielectric", Applied Physics Letters, 94, 2009, 4 pages.
Dean et al., "Boron nitride substrates for high-quality graphene electronics", Nature Nanotechnology, vol. 5, Oct. 2010, 5 pages.
Wu et al., "High-frequency, scaled graphene transistors on diamond-like carbon", Nature, vol. 472, Apr. 7, 2011, 5 pages.
Choi et al., "SiGe epitaxial memory for neuromorphic computing with reproducible high performance based on engineered dislocations", Nature materials, vol. 17, Apr. 2018, pp. 335-340.
Chen et al., "Wafer-scale integration of two-dimensional materials in high-density memristive crossbar arrays for artificial neural networks", Nature Electronics, vol. 3, Oct. 2020, pp. 638-645.
Yeon et al., "Alloying conducting channels for reliable neuromorphic computing", Nature Nanotechnology, vol. 15, Jul. 2020, pp. 574-579.
Molas et al., "(Invited) Resistive Memories (RRAM) Variability: Challenges and Solutions", ECS Transactions, 2018. 14 pages.
Zhao et al., "Atomically Thin Femtojoule Memristive Device", Advanced Materials, 2017, 7 pages.
Xia et al., "Memristive crossbar arrays for brain-inspired computing", Nature Materials, vol. 18, Apr. 2019, pp. 309-323.
Mitchell et al., "Atomically precise control in the design of low-nuclearity supported metal catalysts", Nature Reviews Materials, vol. 6, Nov. 2021, pp. 969-985.
Abraham et al., "Tunable sieving of ions using graphene oxide membranes", Nature Nanotechnology, vol. 12, Jun. 2017, pp. 546-551.
Hu et al., "Chemically Tailoring Coal to Fluorescent Carbon Dots with Tuned Size and Their Capacity for Cu(II) Detection", Small, 2014, vol. 10, No. 23, pp. 4926-4933.
Bahr et al., "Pyrolysis Field Desorption Mass Spectrometry of Polymers", Die Angewandte Makromolekulare Chemie 120, 1984, pp. 163-175.
Sperry et al., "Ligand Pyrolysis during Air-Free Inorganic Nanocrystal Synthesis", Chem. Mater, 2021, 33, pp. 136-145.
Momma et al., "VESTA 3 for three-dimensional visualization of crystal, volumetric and morphology data", Journal of Applied Crystallography, 2011, 44, pp. 1272-1276.
Kresse et al., "Efficiency of ab-initio total energy calculations for metals and semiconductors using a plane-wave basis set", Computational Materials Science, 6, 1996, pp. 15-50.
Kresse et al., "From ultrasoft pseudopotentials to the projector augmented-wave method", Physical Review B, vol. 59, No. 3, Jan. 15, 1999, pp. 1758-1775.
Perdew et al., "Generalized Gradient Approximation Made Simple", Physical Review Letters, vol. 77, No. 18, Oct. 28, 1996, pp. 3865-3868.
Blochl, "Projector augmented-wave method", Physical Review B, vol. 50, No. 24, Dec. 15, 1994, pp. 953-979.
Henkelman et al., "A climbing image nudged elastic band method for finding saddle points and minimum energy paths", The Journal of Chemical Physics, vol. 113, No. 22, Dec. 8, 2000, pp. 9901-9904.

* cited by examiner

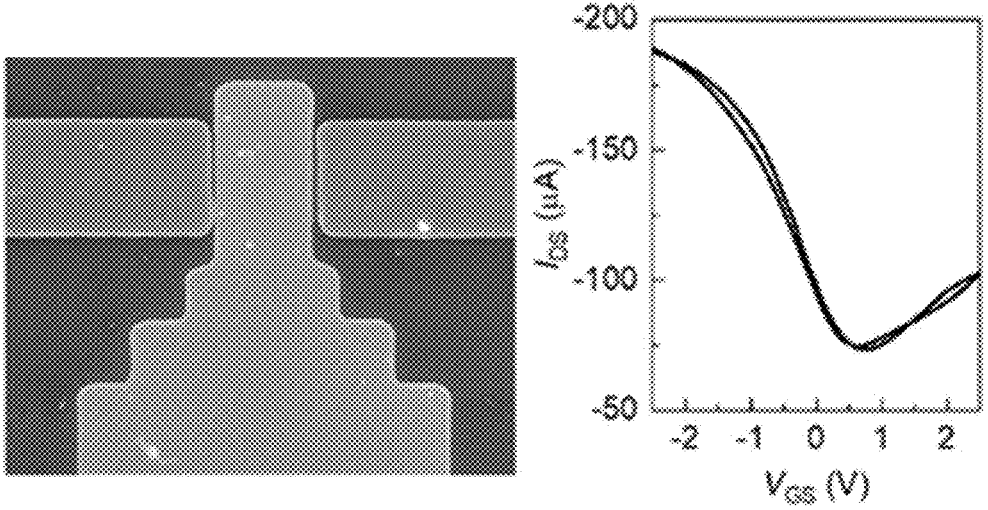
FIG. 5A                    FIG. 5B
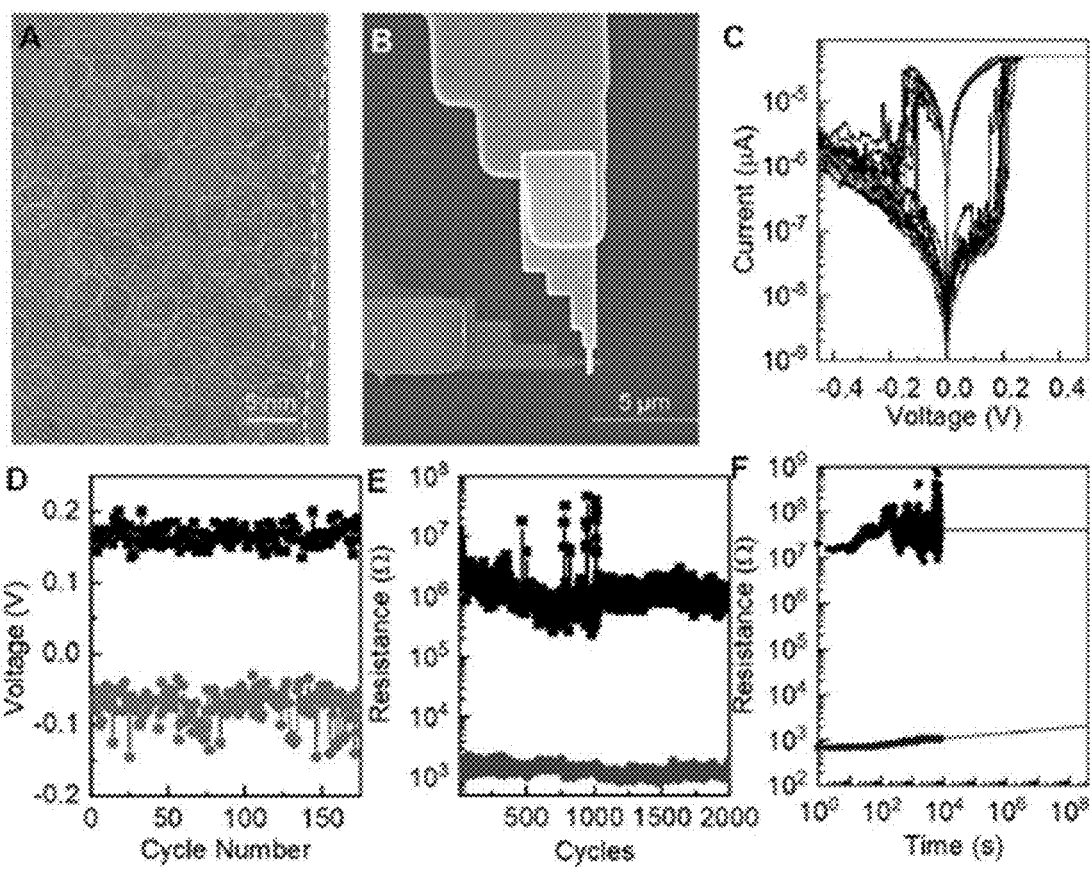
FIG. 6

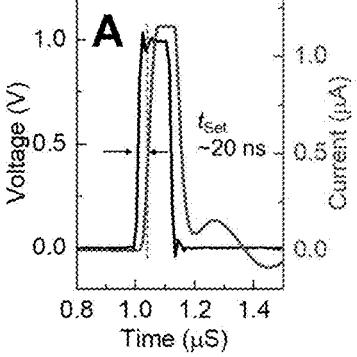 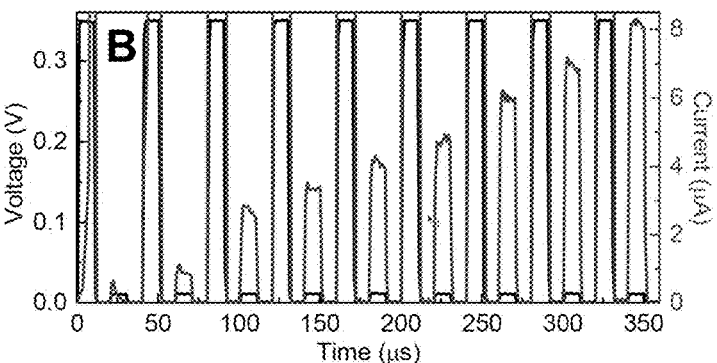
FIG. 7
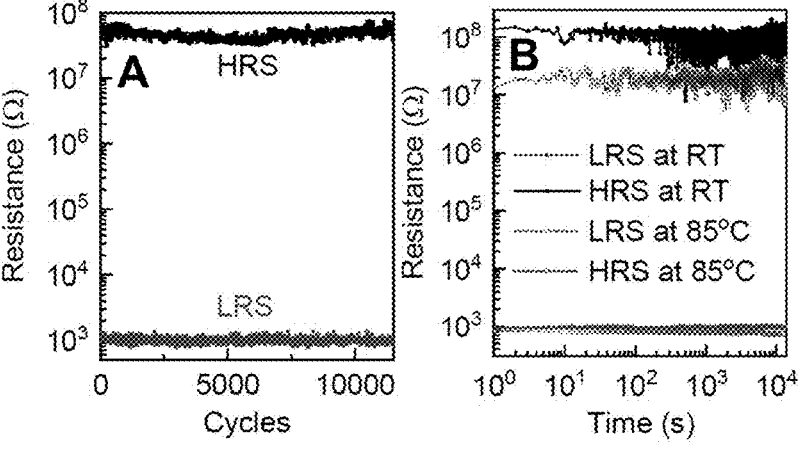 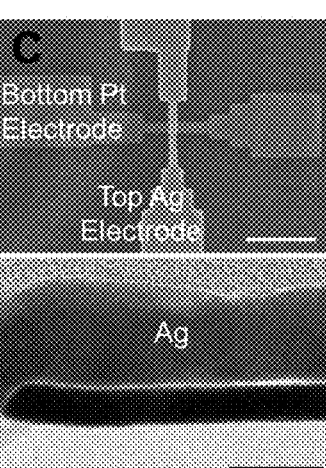
FIG. 8

900

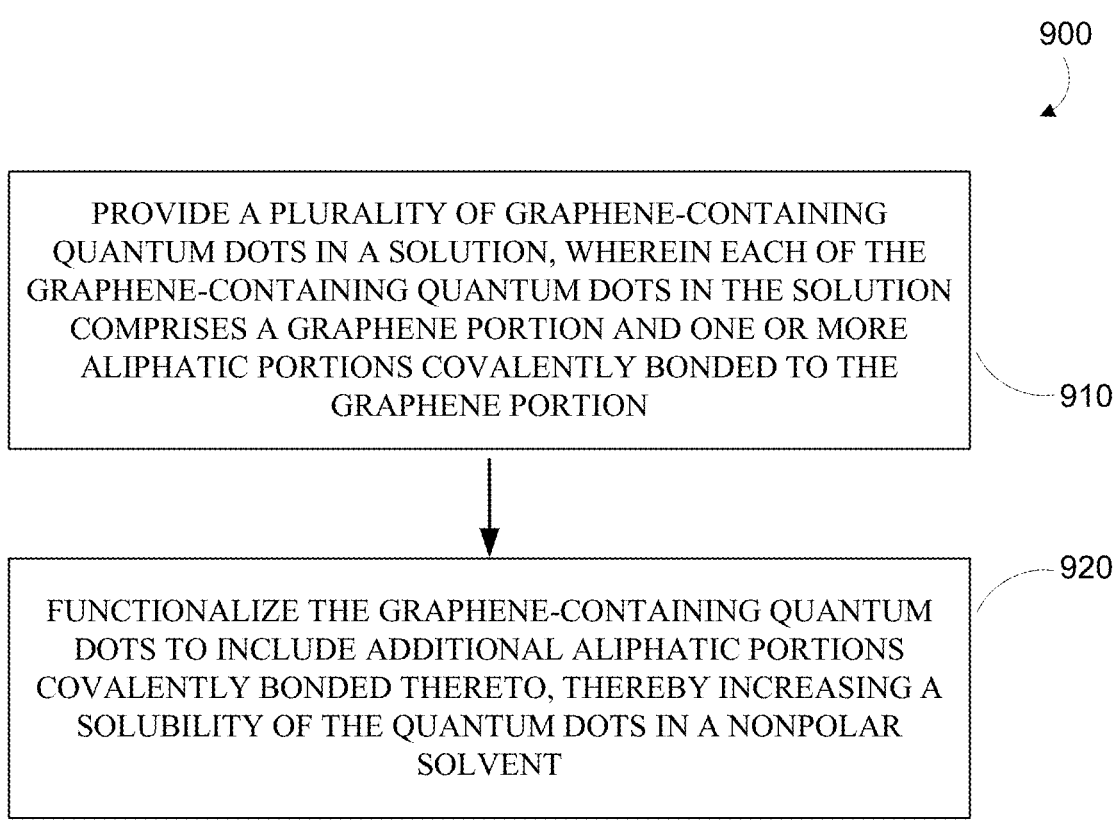

910

PROVIDE A PLURALITY OF GRAPHENE-CONTAINING QUANTUM DOTS IN A SOLUTION, WHEREIN EACH OF THE GRAPHENE-CONTAINING QUANTUM DOTS IN THE SOLUTION COMPRISES A GRAPHENE PORTION AND ONE OR MORE ALIPHATIC PORTIONS COVALENTLY BONDED TO THE GRAPHENE PORTION

920

FUNCTIONALIZE THE GRAPHENE-CONTAINING QUANTUM DOTS TO INCLUDE ADDITIONAL ALIPHATIC PORTIONS COVALENTLY BONDED THERETO, THEREBY INCREASING A SOLUBILITY OF THE QUANTUM DOTS IN A NONPOLAR SOLVENT

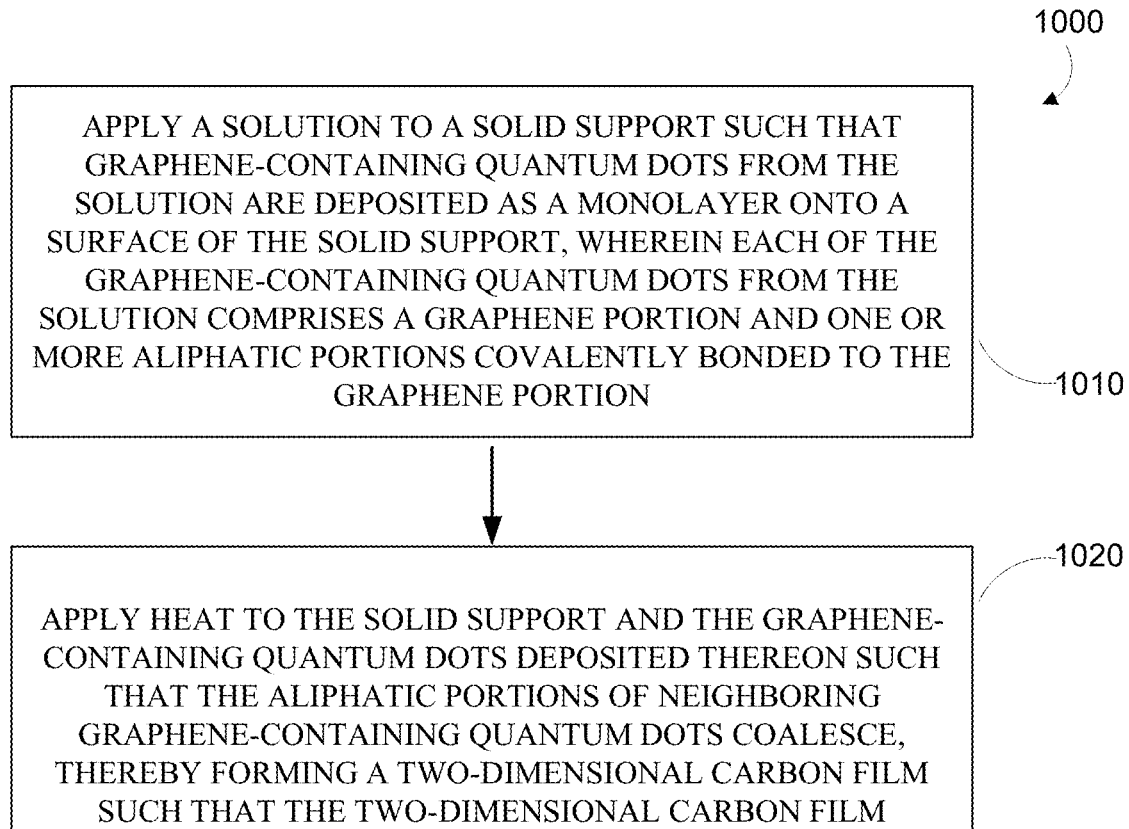

APPLY A SOLUTION TO A SOLID SUPPORT SUCH THAT GRAPHENE-CONTAINING QUANTUM DOTS FROM THE SOLUTION ARE DEPOSITED AS A MONOLAYER ONTO A SURFACE OF THE SOLID SUPPORT, WHEREIN EACH OF THE GRAPHENE-CONTAINING QUANTUM DOTS FROM THE SOLUTION COMPRISES A GRAPHENE PORTION AND ONE OR MORE ALIPHATIC PORTIONS COVALENTLY BONDED TO THE GRAPHENE PORTION

1010

1020

APPLY HEAT TO THE SOLID SUPPORT AND THE GRAPHENE-CONTAINING QUANTUM DOTS DEPOSITED THEREON SUCH THAT THE ALIPHATIC PORTIONS OF NEIGHBORING GRAPHENE-CONTAINING QUANTUM DOTS COALESCE, THEREBY FORMING A TWO-DIMENSIONAL CARBON FILM SUCH THAT THE TWO-DIMENSIONAL CARBON FILM COMPRISES A PLURALITY OF DISCRETE GRAPHENE REGIONS CONNECTED VIA AMORPHOUS CARBON REGIONS

FIGURE 10

2D AMORPHOUS CARBON FILM ASSEMBLED FROM GRAPHENE QUANTUM DOTS

CROSS-REFERENCE TO RELATED APPLICATIONS

The present application is a non-provisional patent application claiming priority to U.S. Provisional Patent Application No. 63/167,422, filed on Mar. 29, 2021 and U.S. Provisional Patent Application No. 63/318,420, filed on Mar. 10, 2022, the contents of which are hereby incorporated by reference.

STATEMENT REGARDING FEDERALLY SPONSORED RESEARCH OR DEVELOPMENT

This invention was made with government support under 89243318CFE000003 awarded by the United States Department of Energy. The government has certain rights in the invention.

BACKGROUND

Two-dimensional (2D) semiconductors and semimetals could enable performance and scaling of solid-state electronic devices beyond the limits of those built on conventional bulk counterparts. However, suitable accompanying 2D dielectrics, ideally in the highly disordered amorphous form to avoid nonuniformity and defects associated with grain boundaries (similar to $SiO_2$ dielectrics grown on silicon) have proven difficult to fabricate, preventing nanoelectronic devices based on low-dimensional nanomaterials from fulfilling their potential. The synthesis of 2D amorphous dielectrics and their integration into electronic devices are challenging due at least in part to the metastable nature of such amorphous phases.

SUMMARY

In a first aspect, a method is provided that includes: (i) providing a plurality of graphene-containing quantum dots in a solution, wherein each of the graphene-containing quantum dots in the solution comprises a graphene portion and one or more aliphatic portions covalently bonded to the graphene portion; and (ii) functionalizing the graphene-containing quantum dots to include additional aliphatic portions covalently bonded thereto, thereby increasing a solubility of the quantum dots in a nonpolar solvent.

In a second aspect, a two-dimensional carbon film is provided that includes a locally substantially planar layer of carbon, wherein the locally substantially planar layer of carbon includes a plurality of discrete graphene regions connected via amorphous carbon regions.

In a third aspect, a semiconductor device is provided that is configured to operate as an amplifier or a switch and that includes, as a gate dielectric, a two-dimensional carbon film that includes a locally substantially planar layer of carbon, wherein the locally substantially planar layer of carbon includes a plurality of discrete graphene regions connected via amorphous carbon regions.

In a fourth aspect, a memristor device is provided that includes a two-dimensional carbon film that includes a plurality of discrete graphene regions connected via regions composed of amorphous carbon, wherein the memristor device is configured to switch between resistance states by forming or destroying conductive filaments through an active region of the two-dimensional carbon film, wherein the active region of the two-dimensional carbon film includes a portion of an amorphous carbon region of the two-dimensional carbon film.

These, as well as other embodiments, aspects, advantages, and alternatives, will become apparent to those of ordinary skill in the art by reading the following detailed description, with reference where appropriate to the accompanying drawings. Further, this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

BRIEF DESCRIPTION OF THE DRAWINGS

FIG. 5A depicts a graphene field effect transistor, in accordance with example embodiments.

FIG. 5B depicts physical properties of the transistor depicted in FIG. 5A.

FIG. 6 depicts a memristor and physical properties thereof, in accordance with example embodiments.

FIG. 7 depicts physical properties of a memristor, in accordance with example embodiments.

FIG. 8 depicts a memristor and physical properties thereof, in accordance with example embodiments.

FIG. 9 is a flowchart of a process, in accordance with example embodiments.

FIG. 10 is a flowchart of a process, in accordance with example embodiments.

DETAILED DESCRIPTION

Figure 1:
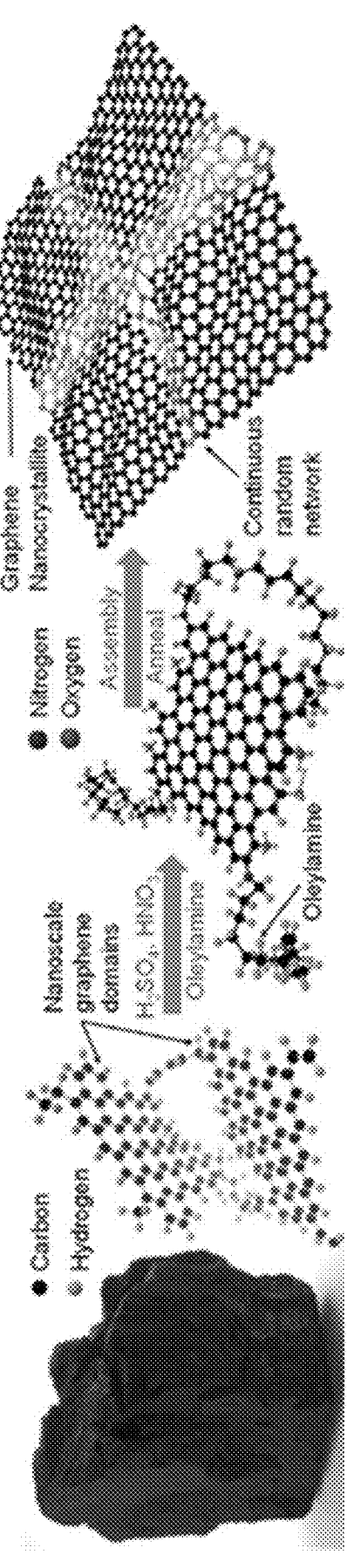
FIG. 1 illustrates aspects of an example 2D amorphous carbon film fabrication process, in accordance with example embodiments.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless stated as such. Thus, other embodiments can be utilized and other changes can be made without departing from the scope of the subject matter presented herein. Accordingly, the example embodiments described herein are not meant to be limiting. It will be readily understood that the aspects of the present disclosure, as generally described herein, and illustrated in the figures, can be arranged, substituted, combined, separated, and designed in a wide variety of different configurations. For example, the separation of features into "client" and "server" components may occur in a number of ways.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

I. Overview

It is desirable in many applications to have access to large, uniform, and continuous atomically thin two-dimensional thin films composed of graphene or other substantially two-dimensional allotropes of carbon. Due to the beneficial geometric, electrical, mechanical, and chemical properties of such thin films, they can be used advantageously as gate dielectrics in semiconductor switches, the switching/storage medium of memristors, as components of other advanced solid-state devices, as nanowires, as mechanical filters, membranes or barriers, as catalyst supports, or as some other component or element of a system.

Currently-available two-dimensional materials for such purposes are generally polycrystalline in nature (e.g., graphene, transition-metal chalcogenides, hexagonal boron nitride). Amorphous two-dimensional dielectric materials share many of the benefits of such polycrystalline materials (e.g., atomic-level thickness, absence of dangling surface bonds) while exhibiting superior electrical and mechanical properties, owing in part to the absence of grain boundaries. However, such amorphous two-dimensional carbon films have historically proven difficult to prepare in a reliable and cost-effective manner over large areas. This is due in part the instability of such amorphous states in carbon networks, which exhibit a tendency to transform into a crystalline phase under conventional nanomaterial growth conditions. Additionally, it has historically proven difficult to incorporate such films into other structures or devices (e.g., semiconductor integrated circuits, a solid support of a nanopore DNA sequencer, a housing or other element of a filter) due to difficulties in releasing such films from a solid support on which they are prepared, incompatibilities between the temperatures or other aspects of the fabrication process and the under/overlying components of a device being formed, or other limitations.

The methods described herein enable the fabrication of two-dimensional carbon films made of one or more carbon layers that each include a plurality of discrete, randomly-oriented graphene-like nanocrystallite regions that are connected via amorphous carbon regions, which are organized as a locally substantially two-dimensional sheet that does not exhibit long-range order. These methods employ low-temperature solution-deposition steps and subsequent annealing/crosslinking steps that are compatible with a variety of other processes and/or associated nanostructures or materials. Further, carbon thin films produced via these methods can be easily separated from their underlying solid support, enabling the deposition of the films onto other substrates (e.g., patterned semiconductor substrates of a memristor chip or other integrated circuit) and/or the use of the free standing films as, e.g., membranes in a battery, filter, or other system.

These methods include disposing a plurality of graphene-containing quantum dots in a carrier fluid (e.g., a nonpolar carrier fluid). Each of the quantum dots includes one or more crystalline graphene portions with one or more aliphatic portions covalently bonded to the edge of the graphene portion(s). These aliphatic portions may include two- or three-dimensional networks of amorphous carbon, long saturated or unsaturated chains of carbon (e.g., to facilitate suspension or dissolution of the quantum dots into the nonpolar carrier fluid), or other types of carbon. The solution containing the quantum dots is then deposited as a monolayer onto a solid support, e.g., a gold support, a $Si/SiO_2$ support, a semiconductor substrate that has already been processed to form elements of transistors, logic gates, memristors, etc. The solid support could include a self-assembled monolayer (e.g., of hexamethyldisilazane) or some other surface coating to facilitate deposition of the quantum dots as a single monolayer on the solid support. Deposition could include spin-coating, formation of a Langmuir-Blodgett film, or some other techniques.

We note that there is not currently an accepted IUPAC name for the graphene-containing quantum dots described herein. These nanoparticles have been alternatively referred to in the literature as "carbon dots," "graphene-containing nanoparticles," "carbon nanoparticles," "graphene quantum dots," and "carbon quantum dots." One of skill in the art will appreciate that the "graphene-containing quantum dots" of this disclosure may be referred to in the alternative by these other terms, and that the meaning of "graphene-containing quantum dots," as it is used in this disclosure, should be interpreted as it is defined within this disclosure in relation to the composition and properties of such graphene-containing quantum dots.

Once deposited as a monolayer onto the solid support, the support and the graphene-containing quantum dots disposed thereon are heated in a reducing or inert environment (e.g., an $N_2$ environment) such that the aliphatic portions of the graphene-containing quantum dots coalesce (in a process which may be referred to as "annealing" or "crosslinking," and which may receive, as the source of the carbon for the coalescence, the carbon content of the carbon chains or other carbon content of the aliphatic regions). This coalescence results in the formation of a continuous single layer of carbon that includes a plurality of discrete graphene-like nanocrystallite regions connected via amorphous carbon regions. Such a layer may be used as a single-layer two-dimensional carbon film. Alternatively, additional carbon layers may be grown via a similar process (e.g., spin-coating a nanoparticle solution onto an already-formed carbon layer) to form a multi-layer two-dimensional carbon film. Both this crosslinking step, and the preceding nanoparticle deposition step, are scalable and compatible with a variety of processes, allowing for efficient, low-cost integration with a variety of fabrication processes and underlying technologies (e.g., integrated circuit manufacture).

The two-dimensional carbon film can then be removed from the substrate and used in a variety of applications. For example, the film could be employed as a free-standing film that forms a membrane of a filter, as a membrane of a pore-based DNA sequencer (following formation of one or more holes through the membrane), as a separation membrane in a battery or capacitor, as a mechanical element of a microelectromechanical sensor or actuator, or as some other free-standing element. In other examples, the two-dimensional carbon film, which is a dielectric material that exhibits high resistivity, can be deposited onto another substrate (e.g., a patterned semiconductor substrate) to be used as a gate dielectric of a transistor, as a memory storage medium of a memristor, or as some other element of an integrated circuit or other device. Separation of the film from the solid support could include forming a support on the film (e.g., spin-coating a layer of PMMA onto the film) and then etching away or otherwise removing the solid support (e.g., using HF to etch away a Si/SiO$_2$ solid support). Additionally or alternatively, the two-dimensional carbon film could be formed "in place" on a solid support that has been formed or patterned to be part of a device that includes the two-dimensional carbon film, e.g. a patterned semiconductor substrate that can form, with the two-dimensional carbon film, a memristor array, logic circuit, array of nanowires, a transistor, or some other element(s) of an integrated circuit, a multipore DNA sequencing sensor element, a filter, or some other device.

As described in greater detail below, two-dimensional carbon films fabricated according to the methods described herein have a variety of useful and distinctive properties when compared to single-crystal graphene. The two-dimensional carbon films as described herein generally act as a dielectric material with high resistivity. The amorphous regions of the two-dimensional carbon film contain large-number carbon rings which provide pathways for the formation of conductive filaments through the large-number carbon rings. Thus, the two-dimensional carbon films described herein can be employed as part of the insulting storage medium of memristor devices, which could be formed with electrodes on either side of the film. Indeed, the very low and uniform thickness of the film means that a memristor formed using such a film can have very low-energy and low-voltage operation, high speed, and other beneficial properties, since only a few atoms will be involved in the formation/destruction of conductive filaments during operation of the device. Additionally, the large-numbered carbon rings of the amorphous regions of the film provide confined pathways for filament formation, leading to improved reproducibility in filament formation and reduced cycle-to-cycle variability. Further, the fabrication processes described herein facilitate the low-cost manufacture of large arrays of memristor devices in a single integrated circuit under a restricted thermal budget.

Also provided are methods for generating the graphene-containing quantum dots from coal. These methods generally include adding strong acids and heat to produce graphene-containing quantum dots, following by extraction of the formed nanoparticles from the minerals or other contents of the coal. These graphene-containing quantum dots may be further functionalized by reaction with saturated or unsaturated chain amines, silanes, alcohols, or other species to facilitate dissolution/suspension of the particles in a nonpolar solvent, to provide additional source carbon for the annealing/crosslinking of the particles together, or to provide some other benefits.

Examples of methods, two-dimensional carbon thin films, and other embodiments are described herein. It should be understood that the words "exemplary," "example," and "illustrative," are used herein to mean "serving as an example, instance, or illustration." Any embodiment or feature described herein as "exemplary," "example," or "illustrative," is not necessarily to be construed as preferred or advantageous over other embodiments or features. Further, the exemplary embodiments described herein are not meant to be limiting. It will be readily understood that certain aspects of the disclosed systems and methods can be arranged and combined in a wide variety of different configurations An example process to prepare a 2D amorphous carbon film as described herein from coal-derived graphene-containing quantum dots is schematically illustrated in FIG. 1. Here, graphene-containing quantum dots with tunable structures are synthesized from coal. The unique structure of coal or related materials, which is composed of angstrom or nanometer-sized crystalline carbon domains linked by aliphatic amorphous carbon, allows the production of graphene-containing quantum dots that include graphene-like crystalline regions with amorphous carbon addends on the edges, whose size and crystallinity can be adjusted over a wide range by using different types of coal or related materials as the starting material and/or modifying the processing parameters in the oxidative displacement reaction.

The oxygen-containing functional groups around the edges of the prepared carbon quantum dots can be further utilized to add additional functional groups, which helps to suspend individual carbon dots in various solvents. Higher degrees of functionalization by organic molecules with long aliphatic chains can be utilized as an effective approach to increase the thickness and/or width of the amorphous carbon shell.

A particular example of the preparation of graphene-containing quantum dots that may be applied as descried herein includes the following steps. First, any rank of natural or synthetic coal (sub-bituminous, bituminous, lignite, anthracite, etc.) or related material (coal tar pitch, coal waste, carbon containing coal byproducts or waste products, coal derived chars, coal fines, coal derived graphite, etc.) is charred at 400-1500 degrees C., preferably 800-1000 degrees C., under an N$_2$ atmosphere, usually for 30 min to 1 hr. The coal char is then ground to powders (e.g., <100 mesh), and a strong acid solution is added to the powder. In an example, a mixture of H$_2$SO$_4$ and HNO$_3$ is added to the powder, with a ratio of, e.g., 80 mL of mixture to 1 gram of powder. The ratio of H$_2$SO$_4$ and HNO$_3$ can be specified to control the size of the graphene quantum dots formed, e.g., a volumetric ratio of 3:1 H$_2$SO$_4$:HNO$_3$ has been observed, in combination with the subsequent heating step below, to result in quantum dots having sizes between 2 and 4 nanometers, while lower ratios (e.g., 2:1 or 1:1) can generate larger graphene quantum dots (e.g., 10 nm or larger). Indeed, a solution containing only HNO$_3$ could be used, but would require an increased reaction temperature. The mixture of acid and char is then heated, e.g., to a temperature between 60 and 150 degrees C., typically to 100 degrees C., for 24 hours to generate the functionalized graphene-containing quantum dots. For the condition of 100 degrees C. applied for 24 hours to the 3:1 acid mixture and 80 mL:1 gram acid:powder mixture, graphene quantum dots with a size of 2-4 nm, at a yield of 10-15 wt %, are obtained. Lower reaction temperatures can be used to generate larger particles (up to hundreds of nanometers) and higher product yields whereas higher reaction temperatures produce smaller particle sizes (less than 1 nm) and lower product yield.

Other sources of the graphene-containing quantum dots may alternatively or additionally be used. For example, natural graphite or synthetic graphite made from non-coal feedstocks (biomass, waste plastics, natural gas, petroleum; CO$_2$) could be used. Additionally or alternatively, graphene-containing quantum dots made from biomass, waste plastics, natural gas, petroleum or CO$_2$ could be used.

The product graphene-containing quantum dots are then extracted from the solution. This can include cooling the reaction mixture to room temperature and then diluting the mixture 20 times with deionized water. This diluted mixture can then be centrifuged, e.g., at 5000 rpm for 10 minutes, to remove unreacted carbon materials and insoluble minerals. The supernatant is then collected and its high acidity neutralized by NaOH or some other suitable means (e.g., KOH, LiOH, $Na_2CO_3$, $K_2CO_3$, $NaHCO_3$, $KHCO_3$) to a pH of about 7. Any resulting salts in the mixture can be removed, e.g., using deionized water and a tangential filtration system with a filtration membrane pore of 1 kD. The product can then be concentrated to a desired concentration of the graphene-containing quantum dots in the water for storage or for application to a solid support to form an amorphous carbon thin film. A concentration of between 2 and 4 mg quantum dots per mL solution has been observed to be stable and suitable for a variety of subsequent processes. However, concentrations between 0.01 and 20 mg quantum dots per mL solution could be useful for storage and/or subsequent processes.

The graphene-containing quantum dots (GQDs) formed as described above may be further functionalized, adding long saturated or unsaturated carbon chains to facilitate suspension of the dots in a nonpolar solvent, to provide additional source carbons for the formation of the connective amorphous carbon regions of a two-dimensional carbon thin film layer, or to provide some other benefits. Such functionalization can include reacting chain amines, silanes, alcohols, and/or other appropriate species to the carboxyl or hydroxyl groups present in the amorphous carbon regions surrounding the crystalline graphene 'cores' of the graphene-containing quantum dots. As an example of such a functionalization process, a desired amount of oleylamine (or octylamine, or some other amine or other desired species) can be dissolved into 2 ml of ethanol and added to 25 ml of 2 mg/ml GQD solution (typically at an oleylamine: carbon ratio of 2:1 by weight, but different oleylamine: carbon or other additive:carbon ratios can be used). The mixture is stirred vigorously for, e.g., at least 1 hour. The functionalized GQDs can then be extracted from the mixture, e.g., by adding 5 ml of toluene or of some other nonpolar solvent. Additionally or alternatively, the mixture could be vacuum filtrated and the filtration cake collected. The resulting product is then dried (e.g., at 80 degrees C.) and then baked (e.g., at 130 degrees C.) in air (e.g., for 30 min). The dried, functionalized GQDs can then be dispersed in toluene or in some other nonpolar solvent to a desired concentration (e.g., 2 to 4 mg/ml).

Spin coating methods or other techniques (e.g., techniques for formation of Langmuir-Blodgett films) are then applied to deposit the carbon quantum dots as a thin film onto a solid support such that they are packed edge-to-edge. For example, the centrifugal forces associated with spin coating could distribute the carbon quantum dots across a substrate functionalized by a self-assembled monolayer, e.g. hexamethyldisilazane (HMDS), which exhibits an attractive interaction with the basal plane of graphene (and thus with the graphene domains of the deposited carbon quantum dots). Heating up such an assembly in an inert atmosphere results in crosslinking between such densely packed core-shell graphene-containing quantum dots to form a homogenous and continuous 2D film through non-catalytic graphitization.

Figure 2:
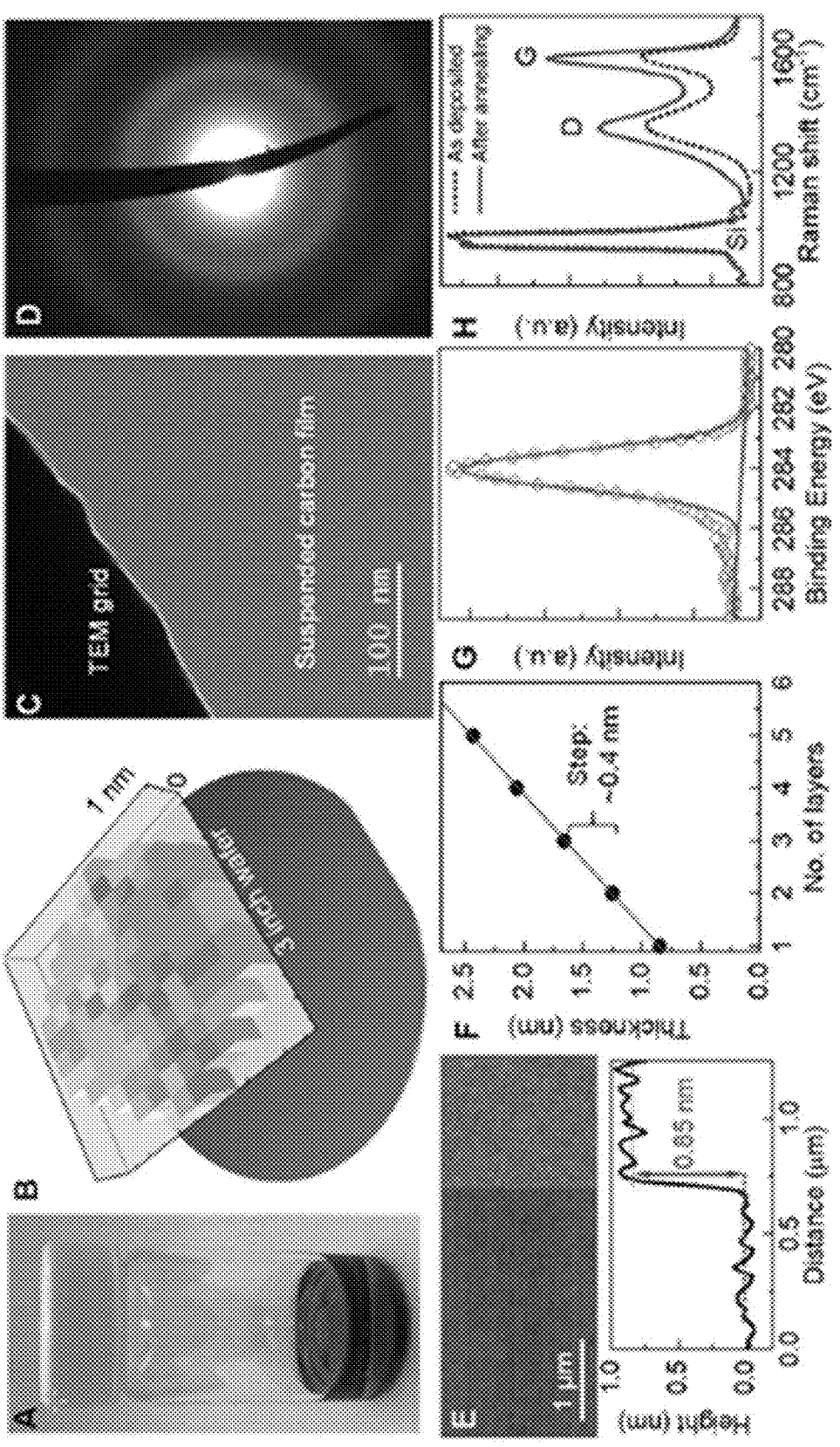
FIG. 2 depicts physical properties of a 2D amorphous carbon film, in accordance with example embodiments.

In a specific example embodiment, carbon quantum dots with average size in the range of 2-3 nm were prepared from Bituminous coal, functionalized by oleylamine, and suspended as a stable and homogenous suspension in toluene (FIG. 2A, an optical image of the carbon quantum dots suspended in toluene, with a concentration of 0.05 mg/mL). The carbon quantum dots were then uniformly deposited across a 3 inch-diameter $SiO_2$/Si wafer functionalized with HMDS by spin casting (concentration of precursor~0.05 mg/mL), and cross-linked to form a continuous film after annealing (e.g., in nitrogen, in a low-$O_2$, low-$H_2O$ glovebox, or some other controlled environment) at 500 degrees C. (FIG. 2B, an optical image of a monolayer 2D amorphous carbon film deposited on a 3 inch $SiO_2$/Si wafer, with a mapping of the film thickness over 96 points superimposed thereon, depicting the uniformity of thickness of the film).

Films formed via these or similar processes as described herein are easily transferred to other substrates. An example of such a transfer process starts with spin casting a thin film of poly(methyl methacrylate) (PMMA) on top of the formed 2D carbon film, followed by selective etching of the support $SiO_2$ in concentrated HF to liftoff the PMMA/2D amorphous carbon hybrid films, which are then transferred to other substrates with the PMMA layer thermally removed in a hydrogen furnace at 350 degrees C. for 2 hours. In addition to flat surfaces, the 2D amorphous carbon films can be transferred to patterned substrates such as TEM grid (FIG. 2C, a low-resolution TEM image of a monolayer film suspended on a TEM grid). Amorphous carbon films as described herein are mechanically robust enough to be suspended as freestanding films, and the uniform contrast throughout such a film indicates that the film is homogenous and continuous. Selective-area electron diffraction (SAED) patterns showed a characteristic diffuse halo (FIG. 2D, an SAED pattern of a monolayer film suspended on a TEM grid), which confirms the amorphous nature of the films.

A 2D carbon film as described herein was patterned by oxygen plasma reactive ion etching (ME) with half of the film protected by a layer of photoresist to form a step height. The film thickness measured by AFM was uniformly approximately 0.85 nm across the whole substrate with surface roughness of 0.1 nm (FIG. 2E, a tapping-mode AFM image of a monolayer 2D amorphous carbon film processed to include a step as described above (top frame), and a plot of the height across the sample (bottom frame)). The measured outcome was comparable to that of single-layer graphene including an approximately 0.4 nm increase in measured thickness related to substrate-2D film and 2D film-tip interactions. This indicates that the film was formed from a single layer of carbon dots with their basal plane aligned approximately parallel to the wafer surface due to the favorable interaction with HMDS.

Multilayered films can be formed by repeatedly creating single layers (e.g., as described above) in a monolayer-by-monolayer fashion. After each cycle of carbon quantum dot deposition and subsequent crosslinking, the thickness of the film increased by approximately 0.4 nm as measured by AFM (FIG. 2F). This is approximately the same as the interlayer spacing of layers of graphene within graphite. The XPS spectrum (FIG. 2G, depicting a high resolution C is XPS spectrum of the carbon film, with the fitted curve showing a single carbon $sp^2$ peak at 284.1 eV) suggested that the bonds in the formed 2D amorphous carbon films are predominantly carbon sp2. The Raman spectrum of the as-deposited carbon dots before and after crosslinking/annealing are compared in FIG. 2H. The increase of the G band to D band ratio suggests that the size of the nanocrystallites increased as they were crosslinked into a continuous amorphous film. The large Raman intensity ratio $I^D/I^G=1.15$ indicates crystallite size and average defect distance were less than 4 nm and 1 nm, respectively.

Figure 3:
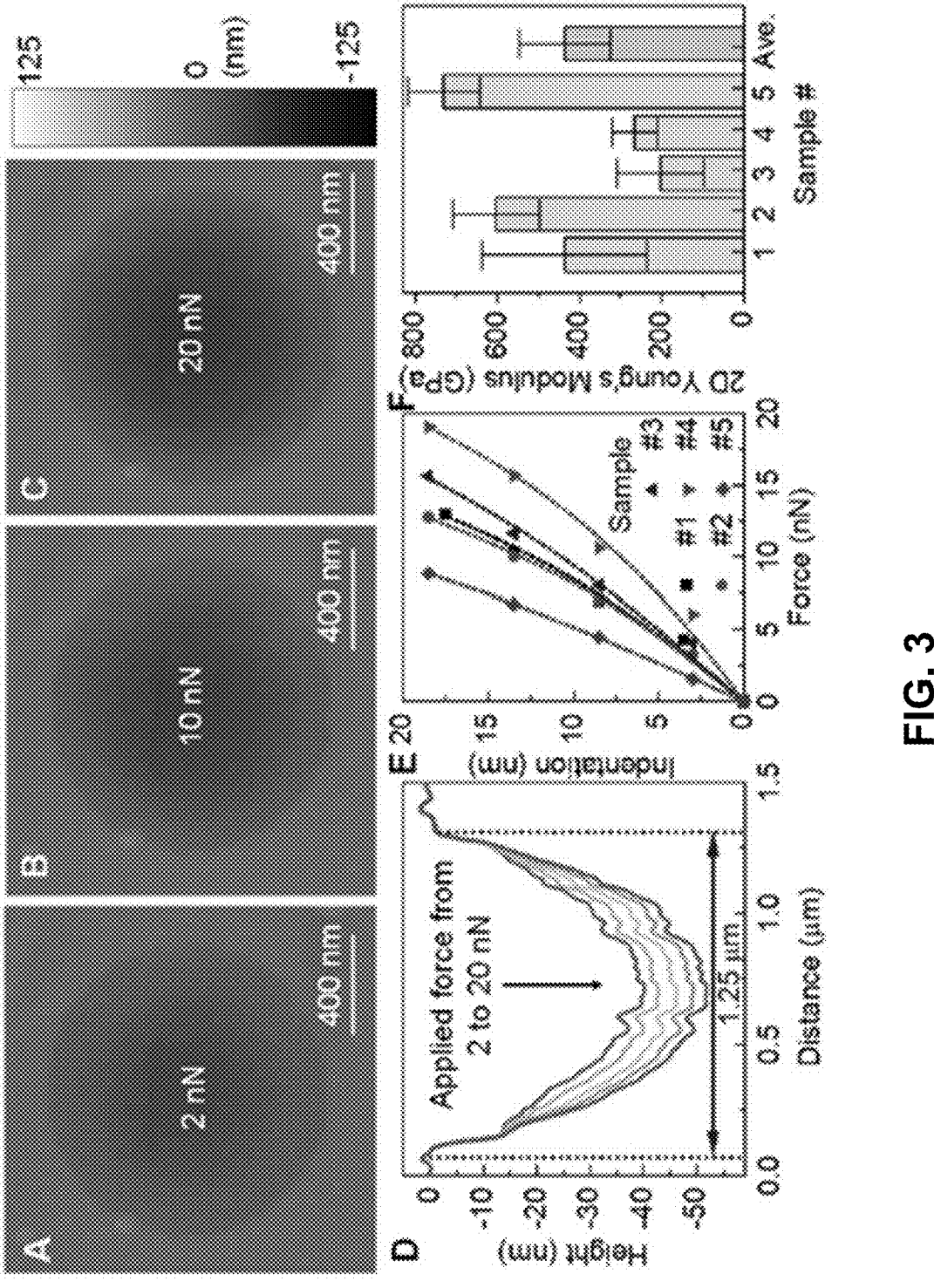
FIG. 3 depicts physical properties of a 2D amorphous carbon film, in accordance with example embodiments.
Figure 4:
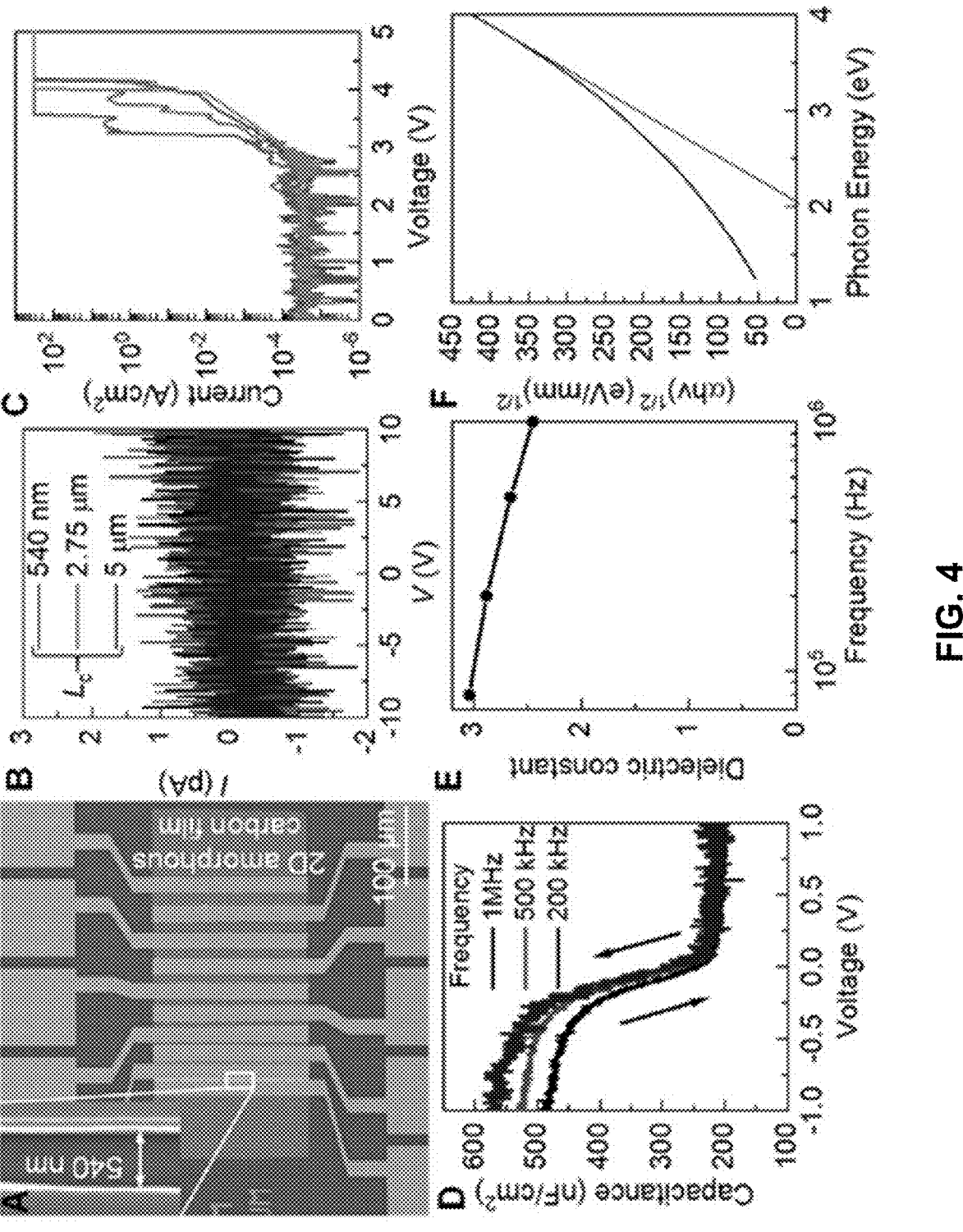
FIG. 4 depicts physical properties of a 2D amorphous carbon film, in accordance with example embodiments.

The mechanical properties of a monolayer 2D amorphous carbon film as described herein were determined by AFM indentation experiments, where 2D amorphous carbon membranes were transferred onto a substrate with arrays of cylindrical holes to produce suspended membranes (FIG. 3). The 2D Young's moduli obtained from the measured force-deflection curves was 400±100 GPa, comparable to that of graphene (FIG. 3F). The electrical conductivity of the film was measured after trimming to form two-terminal resistors with width of 200 μm and length of 540 nm (FIG. 4A). The lateral resistance was above 10 TΩ with the measured current below the detection limit of 1 pA (FIG. 4B). The vertical resistance, as a function of applied voltage, across 3 layers of amorphous carbon films (total thickness~1.6 nm) sandwiched between a graphene bottom electrode and a gold top electrode is plotted in FIG. 4C. The leakage current under low bias is less than $10^{-4}$ A/cm$^2$, allowing for low-power applications as a gate dielectric in transistors for consumer electronics. The current increased sharply with applied voltage above 3.2-4 V, corresponding to a break-down field in excess of 20 MV/cm. This is more than two times higher than the breakdown field strength of crystalline or amorphous boron nitride gate films. The dielectric constant of the carbon films was determined by capacitance-voltage measurements on metal-insulator-semiconductor structures where 10 stacked layers of 2D amorphous carbon films were sandwiched between a single-crystalline silicon substrate and Au top electrode. Substantially no hysteresis was observed, which indicated that the semiconductor-dielectric interface, formed between the underlying silicon and the dangling-bond-free surface of the 2D carbon film, was very high quality (FIG. 4D). The extracted κ value was 3 at 100 kHz and reduced slightly with increased frequency (FIG. 4E). The extracted optical bandgap was ~2.2 eV. Both the bandgap and the dielectric constant are comparable to those of 3D diamond-like carbon.

Three-layered 2D amorphous carbon films as described herein were incorporated into transistors as gate dielectric layers. FIG. 5A depicts and SEM micrograph of such a device using graphene as its channel (a "graphene field effect transistor"), whose transfer characteristics are depicted in FIG. 5B. The high gate capacitance exhibited by these carbon films, related to the nanometer-scale thickness of the gate dielectric formed therefrom, permits a transistor device formed therefrom to be fully operated at low gate voltages of ±2V. The clean Van der Waals interface that the underlying graphene channel forms with such high-quality, substantially dangling-bond-free 2D amorphous carbon gate dielectric films leads to low hysteresis.

Paradigm-shifting memory technologies can facilitate the processing of the exponentially increasing amount of available data, both "on the cloud" (remotely using centralized servers) as well as "on the edge" (inside local devices, while in use, to reduce latency). It is beneficial for such memories to be: 1) non-volatile (retain data without power), 2) energy efficient (e.g., consume less than a pico-Joule of energy per storage operation), 3) high speed (e.g., read/write faster than 10 ns), 4) highly scalable (e.g., below 10×10 nm per device), and/or 5) 3D integratable on Si chips or other conventional semiconductor integrated circuit substrate materials. Conventional static random access memory (SRAM), dynamic random access memory (DRAM), & Flash memories do not meet these metrics and may be near to reaching their theoretical performance limits due to fundamental device-physics & material constraints. New materials and approaches, including those described herein, can facilitate the fabrication of improved memory devices that will power future computing applications.

Resistive random access memories (RRAMs) are a candidate to meet these requirements. RRAMs are two-terminal devices that include a switching medium, which is typically a thin layer of dielectric material(s), sandwiched in between two (or more) electrodes. RRAM operation relies on the reversible electrochemical formation/annihilation of conductive filament bridges between two electrodes as a result of electrical inputs thereto. The formation/annihilation of the conductive filament bridges allows for dynamic modulation of the resistance across the device/between the two electrodes. This class of memory storage device is capable of exhibiting fast switching speeds down to nanoseconds, excellent scalability down to sub-10 nm single-device footprints, direct integration on top of logic components or other features formed from silicon or other semiconductor substrate used to form, e.g., microprocessors, and the capability to non-volatilely store information for more than a decade.

However, previously available RRAMs exhibit poor spatial & temporal device uniformity and high operating switching currents and voltages. These shortcomings may be related to the use of an amorphous metal oxide or chalcogenide as a switching medium. Such materials are difficult to deposit uniformly and repeatably at the reduced thicknesses necessary to provide low-power device operation. In addition, the formation/annihilation of conductive filament bridges in such an amorphous medium is a random and highly variable process, leading to intrinsically large device-to-device and cycle-to-cycle variabilities. Both issues prevent the mass production of RRAMs using previously attempted RRAM storage media.

In contrast, the coal-derived or otherwise produced 2D amorphous carbon films described herein provide an exceptional candidate for the switching-medium layer of improved RRAMs. These carbon films can be made soluble in both aqueous and non-aqueous solvents, allowing them to be deposited using low-cost solution-based processes to form a uniform layer at 1-2 nm thicknesses. Such atomic thinness can facilitate reduction of the operating current, voltage, and energy consumption in RRAMs. This may be related to reduction in the number of atoms involved in the formation/destruction of functionally relevant conductive filaments due to the reduction of the switching-medium-layer thickness.

The carbon films described herein are composed of graphene-like nanocrystallites connected by amorphous-like Zachariasen continuous random networks (FIG. 6A, a high resolution TEM image of a portion of a carbon film as described herein). Large-number carbon rings in the Zachariasen continuous random networks between the graphene-like nanocrystallites provide well defined pathways for filament formation, reducing device variability.

Experimental memristors made with the coal-derived carbon films described herein exhibited reduced device footprints to 30 by 30 nm (FIG. 6B, an SEM of a complete memristor device), ultralow switching voltages down to ~200 mV (FIG. 6C), high information-storage density, minimal device variability with set/reset voltage standard deviation below 20 mV (FIG. 6D, depicting the set (black) and reset (red) voltages of the memristor device across set/reset cycles), improved endurance (FIG. 6E, which depicts the 'on' and 'off' state resistances of the memristor device across set/reset cycles), and non-volatile memory retention estimated above 10 years (FIG. 6F, experimental data extrapolated out to the 10 year period). Experimental memristors made with the coal-derived carbon films described herein exhibited reduced switching times less than 25 nanoseconds (approximately 20 nanoseconds in the example depicted in FIG. 7A) and can be operated to store non-binary information by controlling the resistance of the memristor cell to a variety of different, potentially continuous-values, levels by controlling the period of time that the switching voltage/current is applied (FIG. 7B). The experimental results depicted in FIG. 7A exhibit an energy cost to switch between 'on' and 'off' states that is less than 20 femtojoules. FIGS. 8A-C depict additional data about the long-term retention capability of experimental memristors made with the coal-derived carbon films described herein (depicted above and in cross-section in FIG. 8C). The 'on' and 'off' resistance of the memristor in the 'on' and 'off' states was very stable over more than 10000 switching cycles (FIG. 8A), and the 'on' and 'off' resistance of a memristor set in the 'on' and 'off' states was very stable over more periods of more than 10000 seconds, even at elevated temperatures of 85 degrees C. (FIG. 8B).

II. Example Methods

FIG. 9 illustrates an example method 900. The method 900 includes providing a plurality of graphene-containing quantum dots in a solution, wherein each of the graphene-containing quantum dots in the solution comprises a graphene portion and one or more aliphatic portions covalently bonded to the graphene portion (910). The method 900 also includes functionalizing the graphene-containing quantum dots to include additional aliphatic portions covalently bonded thereto, thereby increasing a solubility of the quantum dots in a nonpolar solvent (920). The method 900 could include additional or alternative elements or steps, e.g., as described elsewhere herein.

FIG. 10 illustrates an example method 1000. The method 1000 includes applying a solution to a solid support such that graphene-containing quantum dots from the solution are deposited as a monolayer onto a surface of the solid support, wherein each of the graphene-containing quantum dots from the solution comprises a graphene portion and one or more aliphatic portions covalently bonded to the graphene portion (1010). The method 1000 also includes applying heat to the solid support and the graphene-containing quantum dots deposited thereon such that the aliphatic portions of neighboring graphene-containing quantum dots coalesce, thereby forming a two-dimensional carbon film such that the two-dimensional carbon film comprises a plurality of discrete graphene regions connected via amorphous carbon regions (1020). The method 1000 could include additional or alternative elements or steps, e.g., as described elsewhere herein

III. Further Embodiments

A scalable and solution-based strategy to prepare large-area and freestanding 2D amorphous carbon monolayers and multilayers, from coal-derived carbon quantum dots as precursors, is provided herein. Such carbon nanolayers can be employed as dielectrics or as other nanoelectronic structures. The synthesized 2D amorphous carbon can be transferred to various substrates and is mechanically robust enough to be suspended over cavities without tearing. Structures were fully characterized by Raman, atomic-force microscopy (AFM), X-ray spectroscopy (XPS), and atomic-resolution transmission electron microscopy (TEM). Resulting from their unique amorphous atomic structures, the prepared 2D amorphous carbon demonstrates robust dielectric properties with resistivity higher than $10^8$ $\Omega \cdot cm$ and dielectric strength above 20 MV cm$^{-1}$. When utilized as gate dielectrics in graphene transistors, the absence of grain boundaries in 2D amorphous carbon helps to achieve a low leakage current density below $10^{-4} A \cdot cm^{-2}$ with a scaled thickness down to three atomic layers (~1.6 nm) for enhanced electrostatic coupling. Meanwhile, their substantially dangling-bond-free van der Waals interface with graphene results in mobility twice as high as that of devices employing $SiO_2$. When implemented as ion-transport media in memristors, the ultrathinness of such 2D amorphous carbon bilayers enables the operation of non-volatile memory cells with low voltage (<0.2 V), fast switching time (<20 ns), and low energy consumption (<20 fJ per operation), without sacrificing endurance and retention. The large-number rings in the amorphous Zachariasen regions of such 2D amorphous carbon nanolayers provide well-defined pathways for the filament formation to minimize device spatiotemporal variability.

Described herein are processes for wafer-scale synthesis of 2D amorphous carbon nanolayers based on the tiling and cross-linking of 0D carbon dots as solution-processable precursors. These 0D carbon dots can be derived from coal, and have a crystalline-amorphous core-shell structure. The prepared 2D amorphous carbon films are composed of nanometre-sized and randomly oriented nano-crystallites embedded in Zachariasen continuous random network (Z-CRN) matrices that can be described by the crystallite model of amorphous solids. The prepared 2D amorphous carbon films are robust dielectrics with low leakage current density and high breakdown voltage. The synthesis strategy described herein is distinct from vacuum depositions, and includes processes that are not only scalable but also that can be repeated in a layer-by-layer fashion in order to produce freestanding films having single or multiple layers with atomically precise thickness. The unprecedented uniformity and thickness control achieved via the methods described herein allow the incorporation of such 2D amorphous carbon films as dielectrics in nanoelectronic devices (e.g., gate dielectrics of field effect transistors, dielectrics of capacitors, storage media for memristor arrays), enabling superior device performances when compared to alternative dielectrics, such as bulk metal oxides or polycrystalline 2D h-BN.

Figure 11:
FIG. 11 depicts experimental results, in accordance with example embodiments.

The synthesis process is schematically illustrated in FIG. 11a. First, 2-4 nm diameter carbon quantum dots were derived from coal char and suspended in toluene after being functionalized with oleylamine. The structure of coal, which is composed of angstrom or nanometer-sized crystalline carbon domains linked by aliphatic carbon chains, allows the production of single-atomic-layer-thick carbon dots with crystallite cores and amorphous carbon addends on the edges thereof. Spin coating subsequently assembles these carbon-dot precursors into a thin film such that they are packed edge-to-edge with random orientations on a substrate functionalized with a self-assembled monolayer of hexamethyldisilazane (HMDS). Annealing the assembly in an inert atmosphere at 500 degrees C. then coalesces these densely packed core-shell carbon dots into a homogenous and continuous 2D film through the thermal-assisted cleavage of the amide bonds, followed by radical addition and non-catalytic graphitization.

A film prepared to cover a 3-inch wafer is shown in FIG. 11b. FIG. 11b includes an optical image of a 2D amorphous carbon monolayer deposited on a 3-inch diameter $SiO_2$/Si wafer with, superimposed thereon, the normalized total Raman intensity for the D and G bands mapped over 96 points to illustrate the uniformity of the film. The color code illustrates a Raman intensity range from 75% to 130% of the average film thickness, with an observed standard deviation of 10%. The macroscopic homogeneity of the film is suggested by the uniformity of the observed Raman intensity across the entire wafer. FIG. 11c depicts the Raman spectra of the as-deposited carbon-dot-precursor assembly and the 2D amorphous carbon film formed after annealing. These Raman spectra indicate a slight growth of the size of the nanocrystallites as they coalesced into a continuous film, as evidenced by the increase of the G to D band ratio, while the nanocrystallite size and the average defect distance remain less than 4 nm and 1 nm, respectively, with the Raman intensity ratio of ID/IG=1.15. FIG. 11d shows high-resolution C1s XPS spectra of the samples on the SiO₂/Si substrate before and after the annealing, indicating that the thermal crosslinking of the carbon-dot-precursor assemblies, which initially contain a mixture of sp² and sp³ hybridized carbon, forms a film predominately composed of sp² carbon substantially without any surface dangling bonds, similar to graphene. The fitted curve (brown solid line, depicting the fitted XPS spectrum post-annealing) shows a single carbon sp² peak at 284.0 eV, while the XPS spectrum of the film prior to annealing (blue dashed line) contains a substantial amount of sp³ carbon with a higher binding energy of 284.8 eV. The XPS spectrum of crystalline graphene transferred onto an SiO₂/Si substrate was also measured as a control to verify the position of the sp² carbon peak (red dashed line of FIG. 11d). The solid green line of FIG. 11d represents the baseline spectrum that was subtracted prior to peak fitting.

The film thickness and surface roughness measured by AFM were about 0.8 nm and 0.1 nm, respectively, both of which are comparable to those of monolayer graphene on SiO₂ (FIG. 11e shows the tapping-mode AFM image of the sample following photolithography and RIE to form an edge in the carbon film and, superimposed thereon, the AFM-measured average sample height as a function of left-right location across the sample, scale bar is 1 μm). The observed~0.4 nm increase in the measured thickness beyond the expected interlayer spacing of graphite is caused by interactions between the substrate and the self-assembled monolayer and 2D film deposited thereon. The smaller film thickness compared to the diameter of the carbon-quantum-dot precursors and the low surface roughness both suggest that the formed film consists of a monolayer of carbon dots with their basal planes aligned parallel to the wafer surface, with this assembly being assisted by favorable interactions with HMDS.

Multilayered films can be formed in a monolayer-by-monolayer fashion. After each deposition-coalescing/annealing cycle, the thickness of the film increased by 0.4 nm (depicted in FIG. 11h, the red solid line is a linear fitting to the data, scale bar is 2 nm), which is comparable to the interlayer spacing of graphite. That the atomic planes are parallel to the wafer surface is clearly visualized in a cross-sectional TEM of the sample (also depicted in FIG. 11f), which depicts a total count of distinct carbon layers (highlighted with red dashed lines) that agrees with the number of deposition cycles performed. With the carbon-dot precursors covalently crosslinked together, the formed 2D amorphous carbon monolayers are mechanically robust enough to be transferred to other substrates as a continuous film, and can be suspended as freestanding membranes on TEM grids for imaging. FIG. 11g depicts a low-resolution TEM image and selected-area electron diffraction (SAED) patterns (inset, scale bar: 5 nm⁻¹) of a 2D amorphous carbon monolayer suspended on a TEM grid (scale bar: 50 nm). The substantially uniform contrast across the area of the film confirms that the film is homogenous and continuous, and the SAED patterns show a characteristic diffuse halo, verifying the amorphous nature of the film.

FIG. 11h depicts a high-resolution TEM image of a 2D amorphous carbon monolayer. White dashed lines mark the boundaries of nanocrystallites (scale bar: 5 nm). Insets of FIG. 11h show the corresponding Fourier transforms of the selected Z-CRN (top) and nanocrystallite (bottom) regions, respectively (scale bar: 2 nm⁻¹). Red arrows point to the Bragg spots. Under the higher resolution depicted in FIG. 11h, the randomly oriented nanocrystalline domains of the film can be visualized, and the localized fast Fourier transforms exhibit characteristic Bragg spots. FIG. 11i depicts an aberration-corrected high-resolution TEM image of a 2D carbon film over a 12×10 nm² region. White dashed lines mark the boundaries of nanocrystallites; the red dashed line marks the boundary of a pin-hole defect used to assist focus (scale bar: 2 nm). The atomic-resolution image from aberration-corrected TEM of FIG. 11i reveals that these 2-4 nm nanocrystallites are connected by Z-CRN regions with distorted and flexible atomic structures rather than sharp crystalline grain boundaries.

FIG. 11j depicts an optical image of a 2D amorphous carbon monolayer transferred to a substrate of Au (200 nm)/SiO₂ (90 nm)/Si, after immersing in Au etchant. The area not covered by the 2D amorphous carbon monolayer appears as dark blue due to the constructive and destructive interference of light reflected from the SiO₂-air and SiO₂-Si interfaces, while the intact Au region corresponds to the extent of the transferred 2D carbon film (scale bar: 1 mm). The inset of FIG. 11j depicts an optical micrograph of the sample with an arrow pointing to an etched pit that corresponds to a pin-hole defect in the transferred 2D amorphous carbon monolayer (scale bar: 10 μm). The results shown in FIG. 11j show that the 2D amorphous carbon monolayer is chemically robust enough to serve as an etching mask, and its defect density after transfer determined by wet-etching based chemical amplification was 17±5×10³ defects per mm². Several factors contribute to the pin-hole defects, such as particles on the substrate, impurities in the precursor solution, and mechanical damage to the film during transfer. The defect density is much lower than the density of boundaries between the precursor carbon dots after assembly, indicating that these carbon dots not only coalesce into a homogenous film after annealing but that the crosslinking mechanism tends to eliminate inter-particle geometric gaps.

Figure 12:
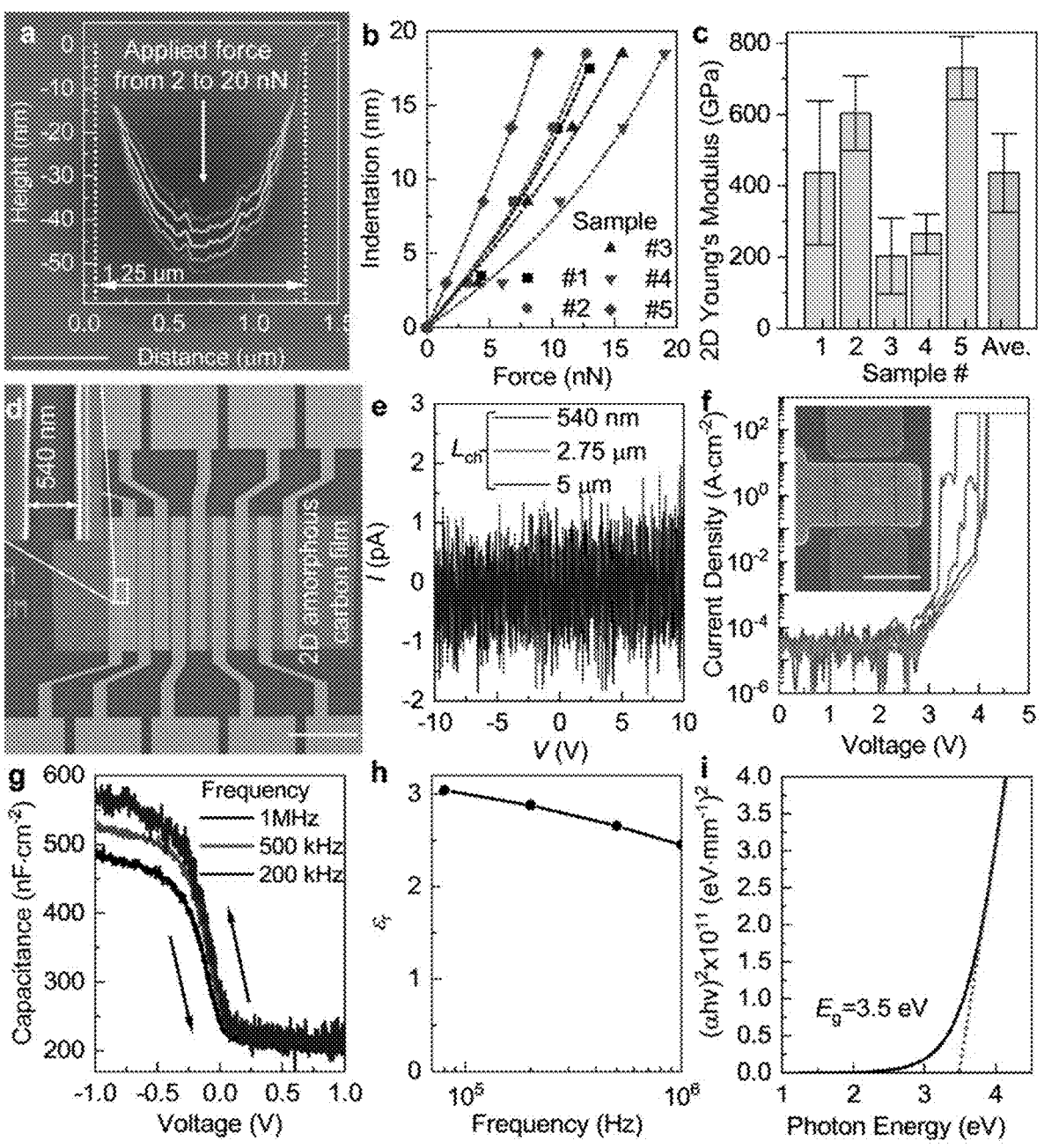
FIG. 12 depicts experimental results, in accordance with example embodiments.

The amorphous atomic structures of the prepared 2D amorphous carbon films lead to its exceptional physical attributes, which distinguish them from graphene. The mechanical properties of the 2D amorphous carbon monolayers were characterized by AFM nanoindentation experiments performed on films suspended over 1.2 μm wide and 3 μm deep circular holes. FIG. 12a depicts an AFM scan of a 2D amorphous carbon monolayer suspended over a 1.25 μm diameter well, with superimposed thereon height profiles from multiple indentations with the applied force being 2, 5, 10, 15, and 20 nN from top to bottom (scale bar: 400 nm). AFM topography was measured in contact mode with the displacement under the applied force (F) determined from the centre of the suspended membranes. The 2D elastic constant was then $$F = \frac{2\pi\sigma\delta}{\ln(a/r)} + \frac{Eq^3\delta^3}{a^2},$$

calculated by fitting the force-displacement curves using the equation of where a and r are the radii of the suspended film and the AFM tip; σ, δ, and E are the 2D pretension, deflection, and 2D Young's modulus, respectively; and q=1.02 is obtained based on the Poisson's ratio of the basal plane of graphite of 0.165. FIG. 12*b* depicts the experimentally measured data (symbols) and the linear elastic deformation expression fitted thereto (dashed lines), and FIG. 12*c* indicates the Young's moduli extracted therefrom. The extracted Young's modulus of 400±100 GPa, which approaches that of crystalline graphene, implies a high level of homogeneity and continuity of the 2D amorphous carbon monolayer prepared from the assembly and coalescence of carbon quantum dots.

FIG. 12*d* depicts a false-colored SEM image of an array of two-terminal devices having a 200 μm channel width (W), used to measure the lateral resistance of the formed 2D amorphous carbon monolayers. The inset of FIG. 12*d* depicts a magnified SEM micrograph showing the smallest $L_{ch}$ down to 540 nm (scale bar: 100 μm). FIG. 12*e* depicts the observed current (I)-voltage (V) curves measured for the two-terminal devices shown in FIG. 12*d* with $L_{ch}$ of 5 μm (blue), 2.75 μm (red), and 540 nm (black), respectively. Even with the channel length ($L_{ch}$) of 540 nm, the measured current flowing laterally along the film was still less than the apparatus detection limit of 1 pA, resulting in a lower bound for the two-terminal resistance above 10 TΩ and resistivity above $3 \times 10^{8}$Ω·cm, which is comparable to that of h-BN.

Vertical (out-of-plane) conductivity was characterized as the leakage current flowing through a metal-insulator-semi-metal capacitor, with the 2D amorphous carbon film separating a graphene bottom electrode from a metal top electrode. FIG. 12*f* depicts the current density flowing vertically across such triple-layered amorphous carbon films (1.6 nm thick) sandwiched between 5 μm-wide graphene bottom electrodes and 5 μm-wide metal top electrodes. Results from four devices were plotted together, each represented by a different colour. The inset of FIG. 12*f* depicts an SEM micrograph of one of the capacitors under test, with red dashed lines indicating the boundary of the graphene bottom electrode (scale bar: 5 μm). A very low leakage current density below $10^{-4}$A·cm$^{-2}$ was obtained across the thin film composed of three consecutively deposited layers of 2D amorphous carbon to afford an overall thickness of 1.6 nm. Compared to exfoliated h-BN with similar thickness, this leakage current density is over 1,000 times lower, this reduction is likely due in part to the absence of grain boundaries. The leakage current increased abruptly above 3 V, leading to electric breakdown with a breakdown field of greater than 20 MV·cm-1, which is more than twice as high as that of crystalline or amorphous $BN_6$.

The dielectric constant ($\varepsilon_r$) of the 2D amorphous carbon was determined from the capacitance-voltage curves of metal-insulator-semiconductor capacitors constructed with 10 stacked layers of 2D amorphous carbon (thickness~4.5 nm) sandwiched between a p-doped silicon wafer and Au top electrode. FIG. 12*g* depicts the results of this assessment, showing the capacitance-voltage characteristics of a disk-shaped 20 μm-diameter metal-insulator-silicon capacitor employing the 2D amorphous carbon film (10 layers, 4.5 nm thick) as the dielectric, measured under different frequencies from 200 kHz (blue), 500 kHz (red), to 1 MHz (black). Arrows indicate the directions of the voltage sweep during the measurement. Substantially no hysteresis was observed, which is indicative of a high-quality interface having been formed between silicon and the substantially dangling-bond-free 2D amorphous carbon film. The extracted Cr was 3 at 100 kHz and reduced slightly with the increase of frequency (FIG. 12*h*, which depicts the frequency dependence of the $\varepsilon_r$ of the 2D amorphous carbon evaluated between $10^4$ and $10^6$ Hz). An effective optical bandgap~3.5 eV was extracted by fitting the Tauc plot, with the absorption coefficient determined via ellipsometry (FIG. 12*i*, depicting the Tauc plot with extrapolation of the linear region (red dashed line) to determine the effective optical bandgap of the 2D amorphous carbon monolayer). These measured properties of 2D amorphous carbon are distinct from graphene but agree with properties are predicted from the electronic structures of the 2D amorphous carbon film calculated using density-functional theory (DFT): electronic states near the Fermi level strongly localize in the Z-CRN regions between nanocrystallites for 2D amorphous carbon, and this leads to both low carrier-transmission probability and the existence of an effective optical bandgap.

Figure 13:
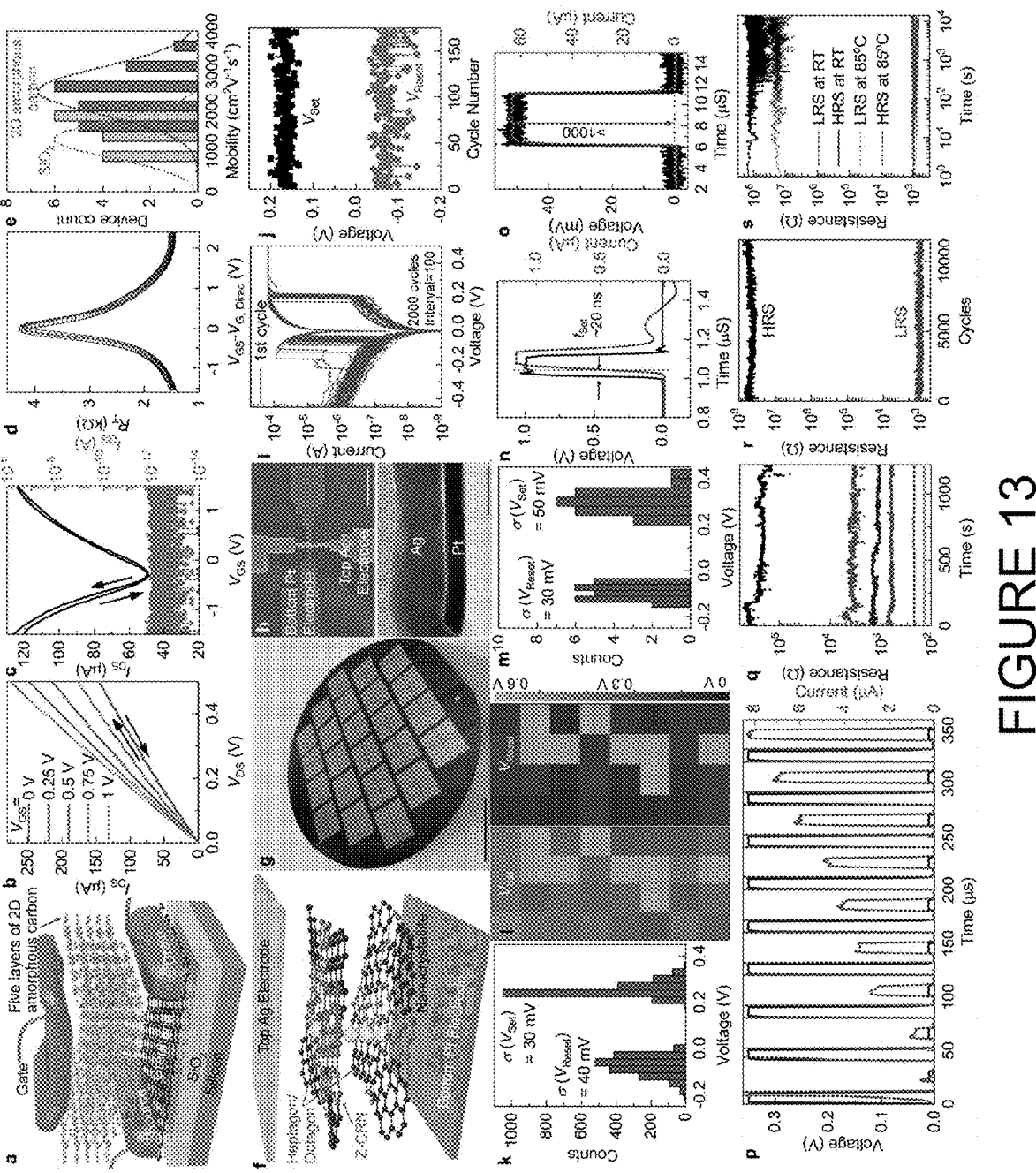
FIG. 13 depicts experimental results, in accordance with example embodiments.

Their intrinsic ultrathinness, atomically smooth surface substantially free of dangling bonds or crystalline grain boundaries, and their robust mechanical and dielectric properties make wafer-scale synthesized 2D amorphous carbon films as described herein promising candidates for use as novel 2D dielectrics to provide nanoelectronic devices with enhanced performance. Five layers of 2D amorphous carbon (thickness~ 2.4 nm) were incorporated as top-gate dielectrics for graphene transistors; a schematic of this device is depicted in FIG. 13*a*. The device $L_{ch}$ and W are both 3.5 μm. FIG. 13*b* depicts the output characteristics of such a top-gated graphene transistor, with arrows indicating the source-drain voltage (VD's) sweeping directions. The gate voltage ($V_{GS}$) increased from 0 V to 1 V from bottom to top at a step of 0.25 V (IDs: source-drain current). The device exhibited a large on-state conductance above 250 μS·μm-1. Compared to bottom-gated devices with 90 nm $SiO_2$ as the gate oxide, the high capacitance provided by the nanometer-thick 2D amorphous carbon film lead to enhanced electrostatic coupling between the metal gate and the graphene channel, which reduced the required gate-voltage swing for full device operation by over one order of magnitude, along with a>10× improvement of the device transconductance. FIG. 13*c* depicts transfer characteristics of the device (left axis, black line) and the associated gate leakage current ($I_{GS}$, right axis, red dots). Arrows indicate the $V_{GS}$ sweeping directions. Applied VDS was 0.2 V. The device hysteresis was reduced from ~20 V to 0.08 V, due at least in part to the elimination of the dangling bonds (and thus a reduction or elimination of charge traps at the interface. Even with the drastically smaller dielectric-layer thickness, the device gate leakage current was still less than the detection limit of ~1 pA over the entire $V_{GS}$ range to minimize the device power consumption in off-state.

FIG. 13*d* depicts the experimental observations (black circles) and model fitting thereto (red solid line) of the change of $R_T$ as a function of the gate overdrive voltage ($V_{GS}$-$V_G$, Dirac). The effective mobility μ of graphene transistors was extracted by fitting the resistance $$R_T = R_c + \frac{L_{ch}}{We\mu\sqrt{n_0^2 + n^2}},$$

profiles to the equation where $R_T$ is the total resistance, $R_c$ is the contact resistance, e is the elementary charge, and $n_0$ is the residual carrier concentration. n is the carrier $$V_{GS} - V_{G,Dirac} = \frac{e}{C_G}n + \frac{\hbar v_F \sqrt{\pi n}}{e},$$

concentration as where $V_{G,Dirac}$ is the Dirac point, $C_G$ is the gate dielectric capacitance, h is the reduced Planck constant, and $V_F \sim 10^8$ CM·S-1 is the Fermi velocity of carriers in graphene. FIG. 13e depicts the effective p of bottom-gated graphene transistors with 90 nm $SiO_2$ gate oxide (green) and top-gated devices with 2D amorphous carbon as the gate dielectric (dark yellow); dashed lines are Gaussian fits to the data. With the $R_c$ and no separately verified by the transmission-line method and capacitance-voltage measurements, it was confirmed that the mobility values extracted from top-gated graphene transistors adopting the 2D amorphous carbon as gate dielectric were on average twice as high as those of back-gated devices employing $SiO_2$. The higher $\mu$ is likely the result, in part, of the absence of the traps and scattering centers that would be associated with dangling bonds at the graphene/dielectric interface and that are substantially absent of the 2D amorphous carbon films. The achievement of low leakage current density, reduced hysteresis, large gate capacitance, and improved $\mu$ in these graphene transistors demonstrates the performance advantages of 2D amorphous carbon films as native 2D amorphous gate dielectrics for 2D-material-based transistors (or indeed, for conventional gated transistors), when compared to either bulk metal oxides or polycrystalline 2D insulators.

Their atomic-level thickness and the presence of large-size carbon rings inside the Z-CRN regions also make 2D amorphous carbon films attractive for use as the insulating ion-transport media in 2D-material-based memristors. DFT simulations indicated that the energy barrier for ions to diffuse through an octagonal carbon ring is drastically lower than crossing the six-membered carbon rings that characterize the graphene-like nanocrystalline regions (0.3 eV versus 14.6 eV, respectively). Thus, the Z-CRNS, being rich in such large-size carbon rings, can provide atomic-scale predefined 1D channels for filament formation in order to reduce device switching spatiotemporal variability. A schematic of such a 2D amorphous carbon film-containing memristor is depicted in FIG. 13f Arrays of $100 \times 100$ $nm^2$ memristors were formed with 2D amorphous carbon bilayers (thickness~1.2 nm) conformally sandwiched between Pt bottom electrodes and Ag top electrodes on a 3-inch wafer. FIG. 13g depicts an optical image of a 3-inch wafer with the Pt/2D amorphous carbon/Ag memristor arrays formed thereon (scale bar: 2 cm). FIG. 13h depicts a top-view SEM micrograph (top frame, scale bar: 1 μm) and cross-sectional TEM image (bottom frame, scale bar: 50 nm) of a completed 2D amorphous carbon based memristor.

Memristors formed in this manner exhibited uniform and forming-free bipolar resistive switching using low set/reset voltages below 0.2 V. FIG. 13i depicts current-voltage characteristics plotted in logarithmic scale for a Pt/2D amorphous carbon/Ag memristor measured across 2,000 consecutive cycles, with the first set/reset curve marked as red and the subsequent curves, with intervals of every 100 cycles, plotted as grey solid lines. FIG. 13j depicts set ($V_{set}$, black) and reset ($V_{reset}$, red) voltage variation across 175 quasi-static I-V sweeps. FIG. 13k depicts a histogram showing the distribution of $V_{set}$ and $V_{reset}$ values extracted from 2,000 quasi-static I-V sweeps of a single device. The overall distributions of switching voltages had a small standard deviation less than 40 mV, which is superior to memristors based on either bulk 3D insulators or polycrystalline h-BN.

In addition to the small cycle-to-cycle variability, the fabricated memristor arrays exhibited high spatial uniformity, likely due at least in part to the uniform presence of nanometer-scale Z-CRN regions across the wafer. The set/ reset voltages were mapped for a 4 by 8 array, as depicted in FIG. 13l which maps both the $V_{set}$ (left frame) and $V_{reset}$ (right frame) values for 32 Pt/2D amorphous carbon/Ag memristors in a 4 by 8 array (orange indicates failed devices without reliable resistive switching behavior). The device yield was 75%, due in large part to delamination of the deposited Ag electrodes during the metal lift-off step, and the standard deviation for device-to-device variability in $V_{set}$ and $V_{reset}$ were less than 50 mV (FIG. 13m).

In addition to exhibiting reduced switching voltages and reduced variability thereof, the ultrathinness of 2D amorphous carbon films and the existence of predefined vertical filament pathways (the large-member rings in the Zachariasen regions) also improve the device operating speed and reduce the device energy consumption by reducing the number of atoms involved and by reducing the drifting distance required to modulate filament formation. FIG. 13n depicts the switching of the memristor with a 100 ns/1 V voltage set pulse to extract the set time ($t_{set}$). The voltage pulse is shown in black in the left axis and the response current is shown in red in the right axis. For such 100 ns-wide voltage pulses with 1 V amplitude under a current compliance of 1 μA, the set time was ~20 ns and was primarily limited by the parasitic capacitance of the device rather than by the intrinsic switching speed of the device. The energy consumption per 'set' transaction is less than 20 fJ, and it is sufficient to induce a resistive switching with a contrast greater than 1,000 (FIG. 13o). FIG. 13p depicts the read current (red, right axis) contrast of the memristor using 10 μs/50 mV read voltage pulses (black, left axis) before (dashed lines) and after (solid lines) the Set transaction shown in FIG. 13n.

FIG. 13p depicts multilevel switching of a Pt/2D amorphous carbon/Ag memristor with a sequence of 10 μs/0.35 V set pulses followed by 10 μs/50 mV read pulses. Intermediate resistive states were accessible with the application of such voltage pulses with smaller amplitudes of 0.35 V. FIG. 13q depicts the retention of such intermediate conductance states measured at room temperature, demonstrating stable data retention for, e.g., energy-efficient neuromorphic computing.

These memristors based on 2D amorphous carbon bilayers can be continuously switched between on- and off-states for more than $10^4$ cycles (FIG. 13r, which depicts the measured alternating high-resistance state (HRS, black) low-resistance state (LRS, red) in ambient). These memristors also exhibit good retention ($>10^4$ s) at room temperature and 85 degrees C. (FIG. 13s, which depicts the change of the measured FIRS (black) and LRS (red) as a function of time, measured both at room temperature (RT, solid) and 85° C. (hollow), respectively). The realization of all these memristor-performance metrics, including the high spatiotemporal uniformity under low operating voltages, fast speed, low energy consumption, high endurance, and stable data retention has not yet been achieved using devices having memristor storage media based on either bulk 3D oxides or polycrystalline 2D materials.

IV. Enumerated Example Embodiments

Embodiments of the present disclosure may thus relate to one of the enumerated example embodiments (EEEs) listed below. It will be appreciated that features indicated with respect to one EEE can be combined with other EEEs.

EEE 1 is a method including: (i) providing a plurality of graphene-containing quantum dots in a solution, wherein each of the graphene-containing quantum dots in the solution comprises a graphene portion and one or more aliphatic portions covalently bonded to the graphene portion; and (ii) functionalizing the graphene-containing quantum dots to include additional aliphatic portions covalently bonded thereto, thereby increasing a solubility of the quantum dots in a nonpolar solvent.

EEE 2 is the method of EEE 1, wherein functionalizing the graphene-containing quantum dots to include additional aliphatic portions covalently bonded thereto comprises reacting the graphene-containing quantum dots with at least one of a chain amine, a chain silane, or a chain alcohol.

EEE 3 is the method of EEE 2, wherein reacting the graphene-containing quantum dots with at least one of a chain amine, a chain silane, or a chain alcohol comprises reacting the graphene-containing quantum dots with a chain amine.

EEE 4 is the method of EEE 3, wherein reacting the graphene-containing quantum dots with a chain amine reacting the graphene-containing quantum dots with at least one of oleylamine or octylamine.

EEE 5 is the method of any of EEEs 1-4, wherein reacting the graphene-containing quantum dots with at least one of a chain amine, a chain silane, or a chain alcohol comprises mixing a first polar solution containing the graphene-containing quantum dots with a second alcohol solution containing the at least one of a chain amine, a chain silane, or a chain alcohol such that a weight ratio, in the mixture of the first polar solution and the second alcohol solution, between the graphene-containing quantum dots and the at least one of a chain amine, a chain silane, or a chain alcohol is between 1:1 and 1:20, or between 1:1 and 1:3.

EEE 6 is the method of any of EEEs 1-5, further comprising, subsequent to reacting the graphene-containing quantum dots with at least one of a chain amine, a chain silane, or a chain alcohol, drying and baking the functionalized graphene-containing quantum dots produced by the reaction.

EEE 7 is the method of EEE 6, wherein baking the functionalized graphene-containing quantum dots produced by the reaction comprises heating the functionalized graphene-containing quantum dots to a temperature between 120 degrees Celsius and 140 degrees Celsius for between 20 minutes and 40 minutes.

EEE 8 is the method of any of EEEs 6-7, further comprising, subsequent to the drying and baking, dispersing the functionalized graphene-containing quantum dots into a nonpolar solvent.

EEE 9 is the method of EEE 8, wherein the nonpolar solvent comprises toluene.

EEE 10 is the method of any of EEEs 1-9, further comprising: deriving the graphene-containing quantum dots from coal, wherein the coal comprises at least one of: bituminous coal, sub-bituminous coal, lignite coal, anthracite coal, coal derived char, coal fines, coal tar pitch, or coal derived graphite.

EEE 11 is the method of EEE 10, wherein deriving the graphene-containing quantum dots from coal comprises charring and powdering the coal.

EEE 12 is the method of EEE 11, wherein charring the coal comprises heating the coal to a temperature between 400 degrees Celsius and 1500 degrees Celsius in a nitrogen atmosphere for between thirty and sixty minutes.

EEE 13 is the method of EEE 12, wherein heating the coal to a temperature between 400 degrees Celsius and 1500 degrees Celsius comprises heating the coal to a temperature between 800 degrees Celsius and 1000 degrees Celsius.

EEE 14 is the method of any of EEEs 11-13, wherein using coal to generate the graphene-containing quantum dots of the solution comprises combining the charred, powdered coal to a strong acid and heating the combined charred, powdered coal and acid to generate graphene-containing quantum dots.

EEE 15 is the method of EEE 14, wherein the strong acid comprises a mixture of $H_2SO_4$ and $HNO_3$, and wherein heating the combined charred, powdered coal and acid to generate graphene-containing quantum dots comprises heating the combined charred, powdered coal and acid to a temperature between 60 degrees Celsius and 150 degrees Celsius for more than thirty minutes.

EEE 16 is the method of any of EEEs 14-15, wherein the graphene-containing quantum dots that are generated by heating the combined charred, powdered coal and acid comprise nanoparticles with sizes between 2 nanometers and 4 nanometers.

EEE 17 is the method of any of EEEs 14-16, wherein deriving the graphene-containing quantum dots from coal further comprises diluting and centrifuging the combined charred, powdered coal and acid to extract the graphene-containing quantum dots therefrom.

EEE 18 is a method including: (i) applying a solution to a solid support such that graphene-containing quantum dots from the solution are deposited as a monolayer onto a surface of the solid support, wherein each of the graphene-containing quantum dots from the solution comprises a graphene portion and one or more aliphatic portions covalently bonded to the graphene portion; and (ii) applying heat to the solid support and the graphene-containing quantum dots deposited thereon such that the aliphatic portions of neighboring graphene-containing quantum dots coalesce, thereby forming a two-dimensional carbon film such that the two-dimensional carbon film comprises a plurality of discrete graphene regions connected via amorphous carbon regions.

EEE 19 is the method of EEE 18, further comprising, subsequent to applying heat to the solid support and the graphene-containing quantum dots deposited thereon such that the aliphatic portions of neighboring graphene-containing quantum dots coalesce: (i) applying an additional solution to the two-dimensional carbon film formed on the solid support such that graphene-containing quantum dots from the additional solution are deposited as a second monolayer layer onto a surface of the two-dimensional carbon film, wherein each of the graphene-containing quantum dots from the additional solution comprises a graphene portion and one or more aliphatic portions covalently bonded to the graphene portion; and (ii) applying heat to the solid support, the two-dimensional carbon film, and the graphene-containing quantum dots deposited thereon such that the aliphatic portions of neighboring graphene-containing quantum dots from the additional solution coalesce, thereby forming an additional layer of the two-dimensional carbon film such that the additional layer of the two-dimensional carbon film comprises a further plurality of discrete graphene regions connected via further amorphous carbon regions.

EEE 20 is the method of any of EEEs 18-19, further comprising: separating the two-dimensional carbon film from the solid support.

EEE 21 is the method of EEE 20, further comprising, subsequent to separating the two-dimensional carbon film from the solid support: (i) depositing the two-dimensional carbon film on a semiconductor substrate; and (ii) forming a semiconductor device from the semiconductor substrate and the two-dimensional carbon film such that the two-dimensional carbon film is configured to provide a gate dielectric for the semiconductor device.

EEE 22 is the method of EEE 21, wherein the semiconductor device comprises at least one of a transistor, a resistor, a semiconductor switch, a diode, a capacitor, or an inductor.

EEE 23 is the method of EEE 20, further comprising, subsequent to separating the two-dimensional carbon film from the solid support: (i) depositing the two-dimensional carbon film on a semiconductor substrate; and (ii) forming a memristor from the semiconductor substrate and the two-dimensional carbon film such that switching of the memristor between resistive states includes the formation or destruction of conductive filaments through at least one amorphous carbon region of the two-dimensional carbon film.

EEE 24 is the method of any of EEEs 18-19, further comprising: forming a plurality of holes through the two-dimensional carbon film.

EEE 25 is the method of any of EEEs 18-19, wherein the solid support comprises a semiconductor substrate, and the method further comprising: forming a semiconductor device from the semiconductor substrate and the two-dimensional carbon film such that the two-dimensional carbon film acts as a gate dielectric for the semiconductor device.

EEE 26 is the method of EEE 25, wherein the semiconductor device comprises at least one of a transistor, a resistor, a semiconductor switch, a diode, a capacitor, or an inductor.

EEE 27 is the method of any of EEEs 18-19, wherein the solid support comprises a semiconductor substrate, and the method further comprising: forming a memristor from the semiconductor substrate and the two-dimensional carbon film such that switching of the memristor between resistive states includes the formation or destruction of conductive filaments through a portion of an amorphous carbon region of the two-dimensional carbon film.

EEE 28 is the method of any of EEEs 18-27, wherein applying heat to the solid support and graphene-containing quantum dots deposited thereon comprises heating the solid support and graphene-containing quantum dots deposited thereon to a temperature above 450 degrees Celsius, for example between 450 degrees Celsius and 550 degrees Celsius.

EEE 29 is the method of any of EEEs 18-28, wherein applying the solution to the solid support such that graphene-containing quantum dots from the solution are deposited as a single layer onto the surface of the solid support comprises spin casting the solution onto the surface of the solid support.

EEE 30 is the method of EEE 28, wherein the solution comprises the graphene-containing quantum dots suspended in a solvent with the graphene-containing quantum dots present in the solution at a concentration between 0.02 milligrams per milliliter and 4 milligrams per milliliter.

EEE 31 is the method of any of EEEs 18-28, wherein applying the solution to the solid support such that graphene-containing quantum dots from the solution are deposited as a single layer onto the surface of the solid support comprises depositing the graphene-containing quantum dots onto the surface as a Langmuir-Blodgett film.

EEE 32 is the method of any of EEEs 18-31, wherein a self-assembled monolayer is present on the surface of the solid support prior to applying the solution to the solid support such that graphene-containing quantum dots from the solution are deposited as a single layer onto the surface of the solid support.

EEE 33 is the method of EEE 32, wherein the self-assembled monolayer comprises hexamethyldisilazane.

EEE 34 is the method of any of EEEs 18-33, wherein the formed two-dimensional carbon film exhibits a two-dimensional Young's modulus between 300 gigapascals and 500 gigapascals.

EEE 35 is the method of any of EEEs 18-34, further comprising forming two additional two-dimensional carbon film layers on the two-dimensional carbon film, and wherein the combination of the three two-dimensional carbon film layers exhibits a leakage current vertically through the three layers that is less than $10^{-4}$ amperes per centimeter squared.

EEE 36 is the method of any of EEEs 18-35, wherein the formed two-dimensional carbon film exhibits a breakdown field through the two-dimensional carbon film that is greater than 20 MV/cm.

EEE 37 is the method of any of EEEs 18-36, wherein the formed two-dimensional carbon film exhibits a dielectric constant that is greater than 3 when an electrical signal is applied to the two-dimensional carbon film at 100 kilohertz.

EEE 38 is a two-dimensional carbon film that comprises a locally substantially planar layer of carbon, wherein the locally substantially planar layer of carbon comprises a plurality of discrete graphene regions connected via amorphous carbon regions.

EEE 39 is the two-dimensional carbon film of EEE 38, further comprising one or more additional locally substantially planar layers of carbon that each comprise a respective further plurality of discrete graphene regions connected via respective further amorphous carbon regions.

EEE 40 is the two-dimensional carbon film of EEE 38 wherein the two-dimensional carbon film includes a plurality of holes formed therethrough.

EEE 41 is the two-dimensional carbon film of any of EEEs 38-40, wherein the two-dimensional carbon film exhibits a two-dimensional Young's modulus between 300 gigapascals and 500 gigapascals.

EEE 42 is the two-dimensional carbon film of any of EEEs 38-41, wherein the two-dimensional carbon film exhibits a leakage current vertically through the two-dimensional carbon film that is less than $10^4$ amperes per centimeter squared.

EEE 43 is the two-dimensional carbon film of any of EEEs 38-42, wherein the two-dimensional carbon film exhibits a breakdown filed through the two-dimensional carbon film that is greater than 30 MV/cm.

EEE 44 is the two-dimensional carbon film of any of EEEs 38-43, wherein the two-dimensional carbon film exhibits a dielectric constant that is greater than 3 when an electrical signal is applied to the two-dimensional carbon film at 100 kilohertz.

EEE 45 is semiconductor device, wherein the semiconductor device is configured to operate as an amplifier or a switch, wherein the semiconductor device includes, as a gate dielectric, a two-dimensional carbon film that comprises a locally substantially planar layer of carbon, wherein the locally substantially planar layer of carbon comprises a plurality of discrete graphene regions connected via amorphous carbon regions.

EEE 46 is the semiconductor device of EEE 45, wherein the two-dimensional carbon film exhibits a dielectric constant that is greater than 3 when an electrical signal is applied to the two-dimensional carbon film at 100 kilohertz.

EEE 47 is the semiconductor device of EEE 45, wherein the two-dimensional carbon film exhibits a leakage current vertically through the two-dimensional carbon film that is less than $10^{-4}$ amperes per centimeter squared.

EEE 48 is the semiconductor device of EEE 45, wherein the two-dimensional carbon film exhibits a breakdown field through the two-dimensional carbon film that is greater than 20 MV/cm.

EEE 49 is the semiconductor device of EEE 45, wherein the two-dimensional carbon film exhibits a thickness that is between 1 nanometer and 10 nanometers.

EEE 50 is the semiconductor device of EEE 45, further comprising a gate electrode that is disposed on the two-dimensional carbon film and that comprises amorphous carbon.

EEE 51 is a memristor device, wherein the memristor device includes a two-dimensional carbon film that comprises a plurality of discrete graphene regions connected via regions composed of amorphous carbon, wherein the memristor device is configured to switch between resistance states by forming or destroying conductive filaments through an active region of the two-dimensional carbon film, wherein the active region of the two-dimensional carbon film includes a portion of an amorphous carbon region of the two-dimensional carbon film.

EEE 52 is the memristor device of EEE 51, wherein the portion of the amorphous carbon region of the two-dimensional carbon film through which the conductive filaments are formed has an area that is less than 900 nanometers squared.

EEE 53 is the memristor device of any of EEEs 51-52, wherein a switching voltage of the memristor device to switch the memristor device between an 'on' state and an 'off' state is less than 225 millivolts.

EEE 54 is the memristor device of any of EEES 51-53, wherein a switching time of the memristor device to switch the memristor device between an 'on' state and an 'off' state is less than 25 nanoseconds.

EEE 55 is the memristor device of any of EEEs 51-54, wherein an energy consumption of the memristor device to switch the memristor device between an 'on' state and an 'off' state is less than 20 femtojoules.

V. Conclusion

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

With respect to any or all of the message flow diagrams, scenarios, and flow charts in the figures and as discussed herein, each step, block, and/or communication can represent a processing of information and/or a transmission of information in accordance with example embodiments.

Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purpose of illustration and are not intended to be limiting, with the true scope being indicated by the following claims.

What is claimed is:

1. A method comprising:
   applying a solution to a solid support such that graphene-containing quantum dots from the solution are deposited as a monolayer onto a surface of the solid support, wherein each of the graphene-containing quantum dots from the solution comprises a graphene portion and one or more aliphatic portions covalently bonded to the graphene portion; and
   applying heat to the solid support and the graphene-containing quantum dots deposited thereon such that the aliphatic portions of neighboring graphene-containing quantum dots coalesce, thereby forming a two-dimensional carbon film such that the two-dimensional carbon film comprises a plurality of discrete graphene regions connected via amorphous carbon regions.

2. The method of claim 1, further comprising, subsequent to applying heat to the solid support and the graphene-containing quantum dots deposited thereon such that aliphatic portions of neighboring graphene-containing quantum dots coalesce:
   applying an additional solution to the two-dimensional carbon film formed on the solid support such that graphene-containing quantum dots from the additional solution are deposited as a second monolayer layer onto a surface of the two-dimensional carbon film, wherein each of the graphene-containing quantum dots from the additional solution comprises a graphene portion and one or more aliphatic portions covalently bonded to the graphene portion; and
   applying heat to the solid support, the two-dimensional carbon film, and the graphene-containing quantum dots deposited thereon such that the aliphatic portions of neighboring graphene-containing quantum dots from the additional solution coalesce, thereby forming an additional layer of the two-dimensional carbon film such that the additional layer of the two-dimensional carbon film comprises a further plurality of discrete graphene regions connected via further amorphous carbon regions.

3. The method of claim 1, further comprising:
separating the two-dimensional carbon film from the solid support.

4. The method of claim 3, further comprising, subsequent to separating the two-dimensional carbon film from the solid support:
depositing the two-dimensional carbon film on a semiconductor substrate; and
forming a semiconductor device from the semiconductor substrate and the two-dimensional carbon film such that the two-dimensional carbon film is configured to provide a gate dielectric for the semiconductor device.

5. The method of claim 4, wherein the semiconductor device comprises at least one of a transistor, a resistor, a semiconductor switch, a diode, a capacitor, or an inductor.

6. The method of claim 3, further comprising, subsequent to separating the two-dimensional carbon film from the solid support:
depositing the two-dimensional carbon film on a semiconductor substrate; and
forming a memristor from the semiconductor substrate and the two-dimensional carbon film such that switching of the memristor between resistive states includes the formation or destruction of conductive filaments through at least one amorphous carbon region of the two-dimensional carbon film.

7. The method of claim 1, further comprising:
forming a plurality of holes through the two-dimensional carbon film.

8. The method of claim 1, wherein the solid support comprises a semiconductor substrate, and the method further comprising:
forming a semiconductor device from the semiconductor substrate and the two-dimensional carbon film such that the two-dimensional carbon film acts as a gate dielectric for the semiconductor device.

9. The method of claim 8, wherein the semiconductor device comprises at least one of a transistor, a resistor, a semiconductor switch, a diode, a capacitor, or an inductor.

10. The method of claim 1, wherein the solid support comprises a semiconductor substrate, and the method further comprising:

forming a memristor from the semiconductor substrate and the two-dimensional carbon film such that switching of the memristor between resistive states includes the formation or destruction of conductive filaments through a portion of an amorphous carbon region of the two-dimensional carbon film.

11. The method of claim 1, wherein applying heat to the solid support and graphene-containing quantum dots deposited thereon comprises heating the solid support and graphene-containing quantum dots deposited thereon to a temperature between 450 degrees Celsius and 550 degrees Celsius.

12. The method of claim 1, wherein a self-assembled monolayer is present on the surface of the solid support prior to applying the solution to the solid support such that graphene-containing quantum dots from the solution are deposited as a single layer onto the surface of the solid support.

13. The method of claim 12, wherein the self-assembled monolayer comprises hexamethyldisilazane.

14. The method of claim 1, wherein the formed two-dimensional carbon film exhibits a two-dimensional Young's modulus between 300 gigapascals and 500 gigapascals.

15. The method of claim 1, further comprising forming two additional two-dimensional carbon film layers on the two-dimensional carbon film, and wherein the combination of the three two-dimensional carbon film layers exhibits a layers leakage current vertically through the three layers that is less than $10^{-4}$ amperes per centimeter squared.

16. The method of claim 1, wherein the formed two-dimensional carbon film exhibits a breakdown voltage through the two-dimensional carbon film that is greater than 3.2 volts.

17. The method of claim 1, wherein the formed two-dimensional carbon film exhibits a dielectric constant that is greater than 3 when an electrical signal is applied to the two-dimensional carbon film at 100 kilohertz.

* * * * *